(12) United States Patent
Yamanaka

(10) Patent No.: US 10,514,684 B2
(45) Date of Patent: Dec. 24, 2019

(54) SCHEDULE PREPARATION METHOD FOR SUBSTRATE PROCESSING DEVICE AND SUBSTRATE PROCESSING DEVICE

(71) Applicant: SCREEN Holdings Co., Ltd., Kyoto (JP)

(72) Inventor: Satoshi Yamanaka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 307 days.

(21) Appl. No.: 15/320,055

(22) PCT Filed: Jun. 11, 2015

(86) PCT No.: PCT/JP2015/066901
§ 371 (c)(1),
(2) Date: Dec. 19, 2016

(87) PCT Pub. No.: WO2015/198885
PCT Pub. Date: Dec. 30, 2015

(65) Prior Publication Data
US 2017/0160731 A1 Jun. 8, 2017

(30) Foreign Application Priority Data
Jun. 23, 2014 (JP) ................................. 2014-128331

(51) Int. Cl.
*G05B 19/41* (2006.01)
*H01H 43/04* (2006.01)
(Continued)

(52) U.S. Cl.
CPC ... *G05B 19/41865* (2013.01); *G05B 19/4188* (2013.01); *H01H 43/04* (2013.01);
(Continued)

(58) Field of Classification Search
CPC .. G03F 7/70725; G03F 9/7046; G03F 9/7049; H01L 21/67276; H01L 21/02;
(Continued)

(56) References Cited

U.S. PATENT DOCUMENTS 5,128,860 A 7/1992 Chapman ...................... 364/401
6,898,702 B1 * 5/2005 Evans ................ H04Q 11/0005
398/106

(Continued)

FOREIGN PATENT DOCUMENTS

JP H02-297634 12/1990
JP 2003-100576 4/2003

(Continued)

OTHER PUBLICATIONS

International Search Report dated Aug. 11, 2015 in corresponding PCT International Application No. PCT/JP2015/066901.

(Continued)

*Primary Examiner* — Michael J Brown
(74) *Attorney, Agent, or Firm* — Ostrolenk Faber LLP

(57) ABSTRACT

A method by which a schedule preparing portion included in a substrate processing apparatus, having at least one single substrate processing unit and a controller, prepares a chronological schedule for operations of the substrate processing apparatus. The method includes a schedule preparation step of preparing a schedule for each substrate by positioning, in chronological order, a plurality of blocks, each specifying an operation to be performed on the substrate. The schedule preparation step includes a high load avoidance positioning step in which, in preparing a schedule for a plurality of substrates, blocks corresponding to a high load operation in which a high control load occurs at least temporarily in the
(Continued)

controller are positioned on a time axis so that high load time slots, during which a high control load occurs in the controller, are not concentrated.

9 Claims, 32 Drawing Sheets

(51) Int. Cl.
*H01H 43/16* (2006.01)
*H01L 21/02* (2006.01)
*G05B 19/418* (2006.01)
*H01L 21/67* (2006.01)

(52) U.S. Cl.
CPC ............ *H01H 43/16* (2013.01); *H01L 21/02* (2013.01); *H01L 21/02008* (2013.01); *H01L 21/67051* (2013.01); *H01L 21/67253* (2013.01); *G05B 2219/00* (2013.01); *G05B 2219/45031* (2013.01); *Y02P 90/20* (2015.11)

(58) Field of Classification Search
CPC ........ H01L 21/02008; G05B 19/41865; G05B 2219/45031
USPC .......................................... 700/100, 101, 121
See application file for complete search history.

(56) References Cited

U.S. PATENT DOCUMENTS

| | | | |
|---|---|---|---|
| 2003/0055522 A1 | 3/2003 | Mukuta et al. | 700/100 |
| 2003/0204488 A1 | 10/2003 | Sentoku et al. | 707/1 |
| 2005/0085017 A1 | 4/2005 | Ito et al. | 438/115 |
| 2006/0253225 A1 | 11/2006 | Ueno et al. | 700/298 |
| 2010/0174397 A1 | 7/2010 | Takuma | 700/112 |
| 2012/0016506 A1 | 1/2012 | Yokogawa | 700/95 |
| 2013/0073069 A1 | 3/2013 | Yamamoto et al. | 700/100 |
| 2014/0277666 A1* | 9/2014 | Morkos | G06Q 10/06 700/100 |

FOREIGN PATENT DOCUMENTS

| | | |
|---|---|---|
| JP | 2003-324044 A | 11/2003 |
| JP | 2006-230146 | 8/2006 |
| JP | 2008-118068 A | 5/2008 |
| JP | 2010-161164 | 7/2010 |
| JP | 2010-217945 | 9/2010 |
| JP | 2013-077796 | 4/2013 |
| TW | 200302425 A | 8/2003 |

OTHER PUBLICATIONS

Written Opinion dated Aug. 11, 2015 in corresponding PCT International Application No. PCT/JP2015/066901.

* cited by examiner

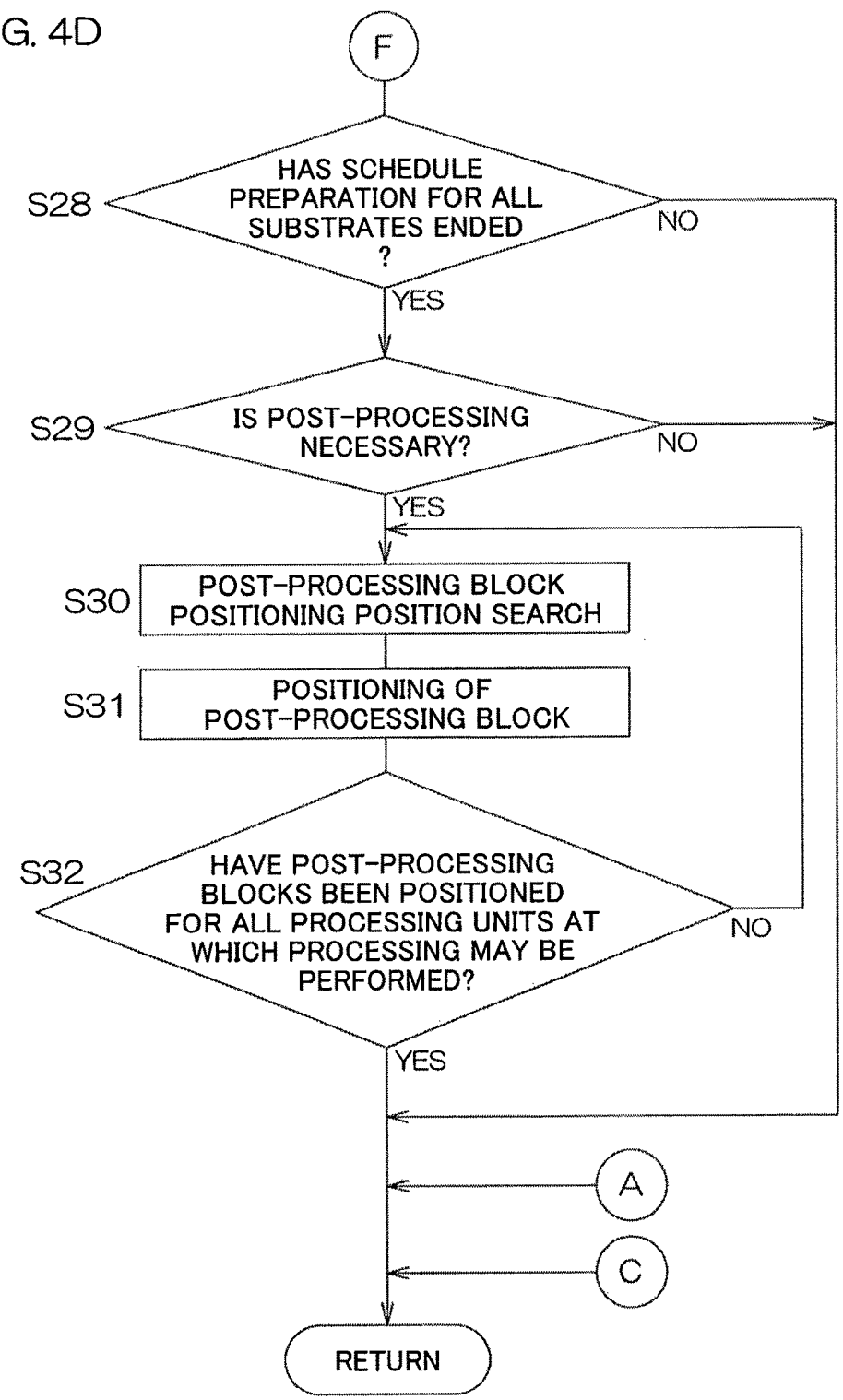

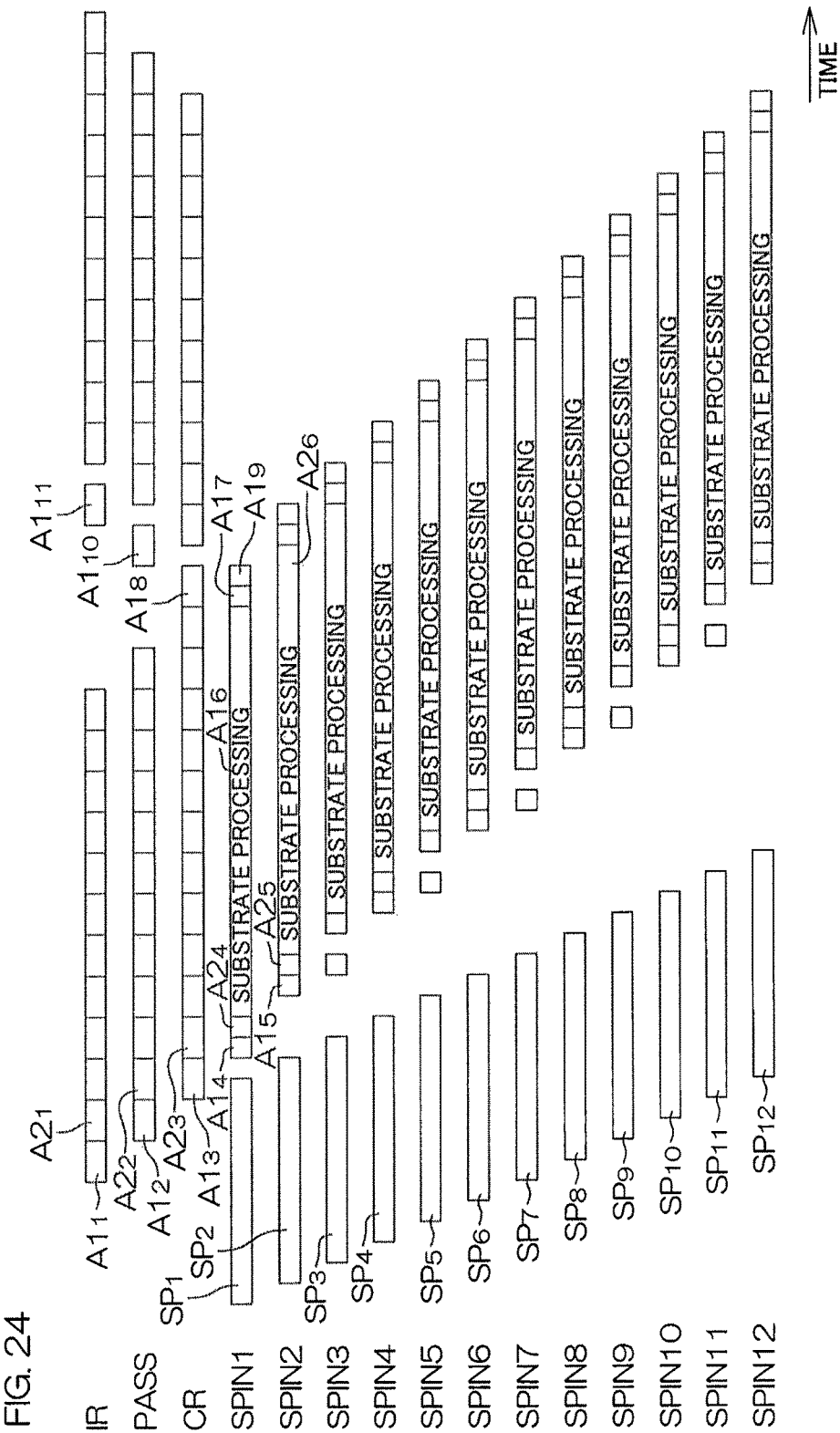

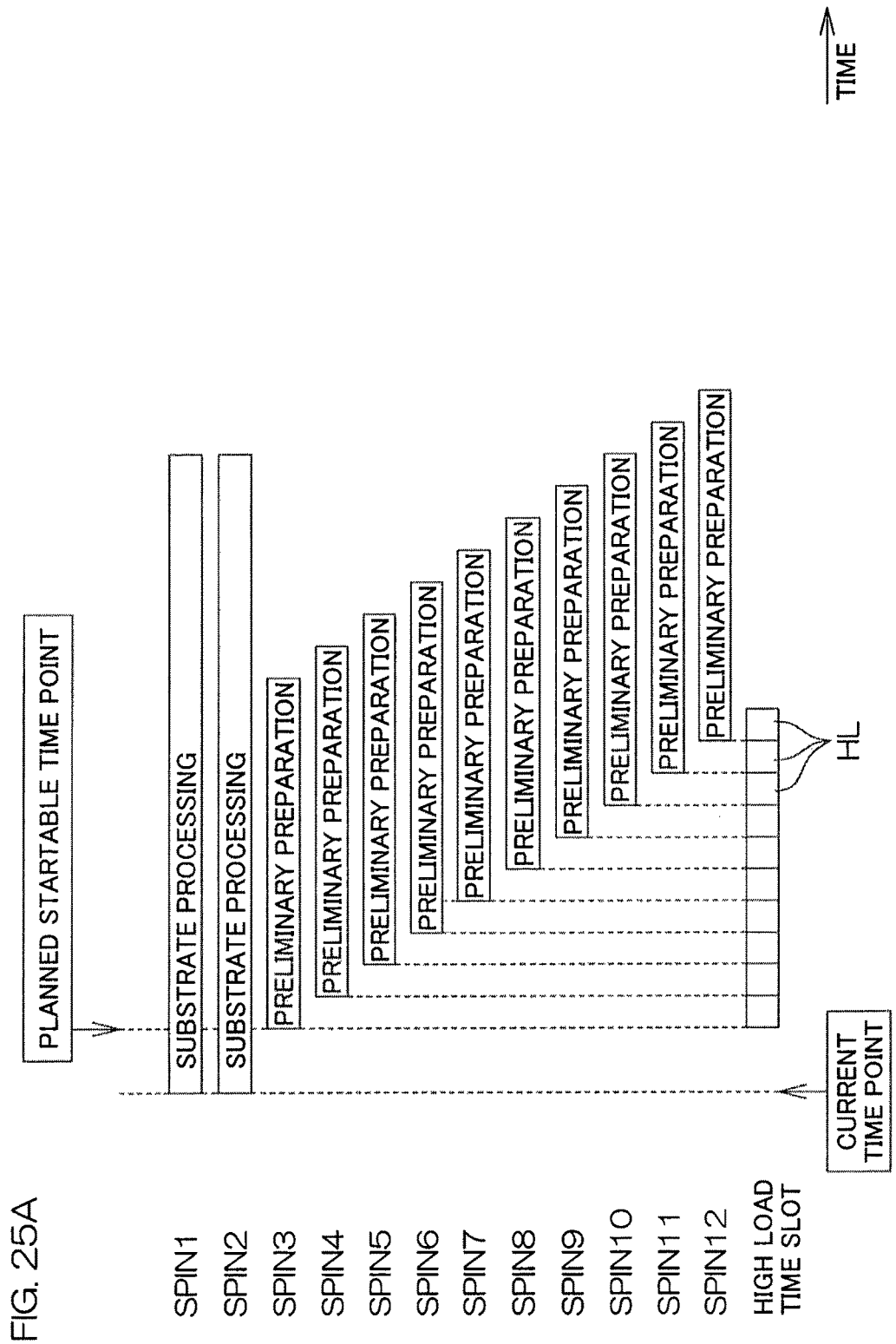

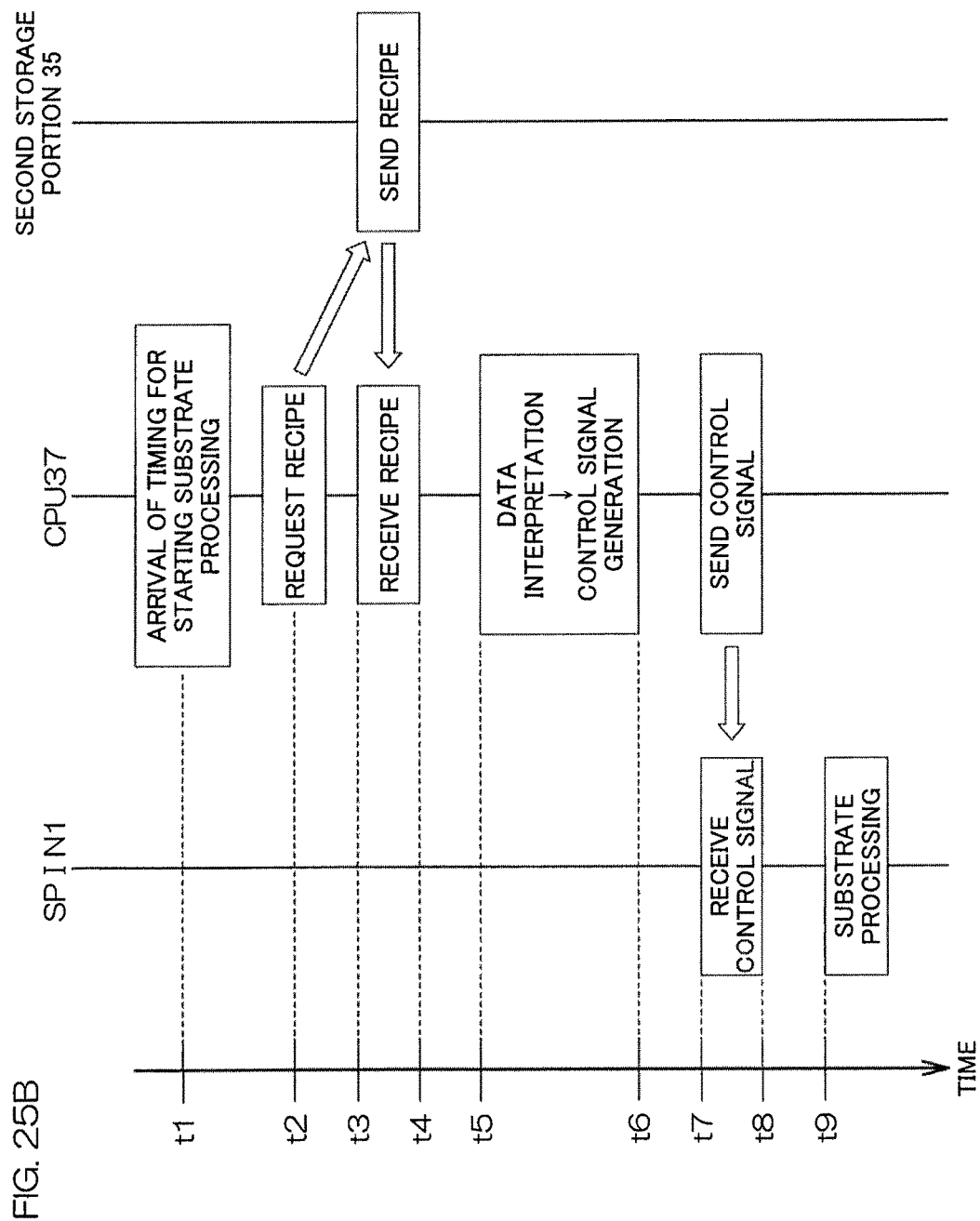

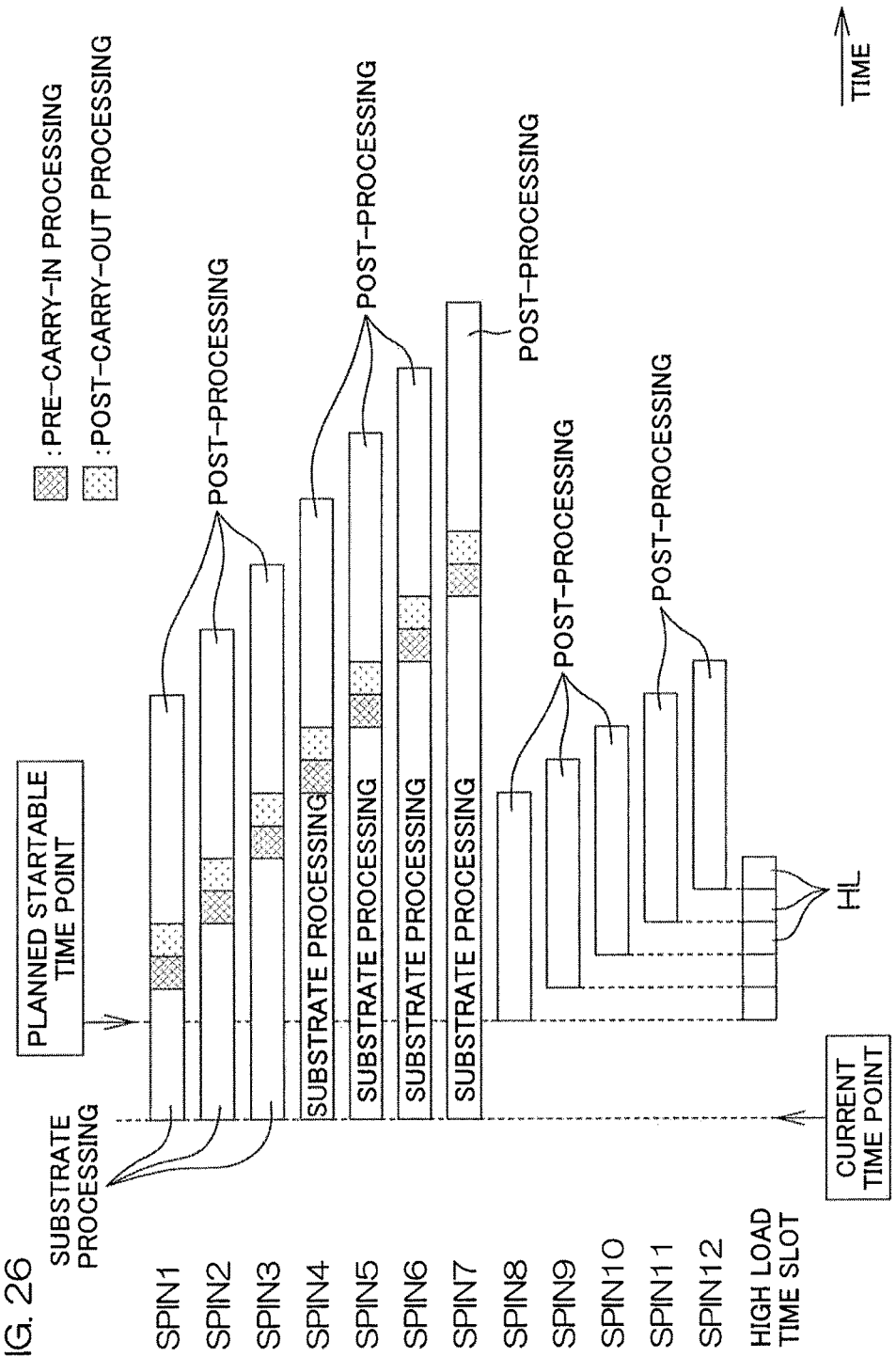

SCHEDULE PREPARATION METHOD FOR SUBSTRATE PROCESSING DEVICE AND SUBSTRATE PROCESSING DEVICE

CROSS-REFERENCE TO RELATED APPLICATIONS

The present application is a 35 U.S.C. §§ 371 national phase conversion of PCT/JP2015/066901, filed Jun. 11, 2015, which claims priority to Japanese Patent Application No. 2014-128331, filed Jun. 23, 2014, the contents of both of which are incorporated herein by reference. The PCT International Application was published in the Japanese language.

TECHNICAL FIELD

The present invention relates to a method for preparing a schedule, which specifies operations of a substrate processing apparatus in chronological order, and to a substrate processing apparatus. Examples of a substrate to be processed by the substrate processing apparatus include semiconductor wafers, substrates for liquid crystal display devices, substrates for plasma displays, substrates for FEDs (field emission displays), substrates for optical disks, substrates for magnetic disks, substrates for magnetooptical disks, substrates for photomasks, ceramic substrates, substrates for solar cells, etc.

PRIOR ART

In a manufacturing process for a semiconductor device or a liquid crystal display device, etc., a single substrate processing type substrate processing apparatus, by which a substrate, such as a semiconductor wafer, a glass substrate for liquid crystal display device, etc., is processed one at a time, or a batch type substrate processing apparatus, by which a lot, constituted of a plurality of substrates, is processed in a batch, is used. A method for preparing a schedule that specifies operations of a single substrate processing type substrate processing apparatus in chronological order is disclosed in Patent Literature 1.

PRIOR ART DOCUMENT

Patent Literature

Patent Literature 1: Japanese Patent Application Publication No. 2013-77796

SUMMARY OF THE INVENTION

Problems to be Solved by the Invention

A single substrate processing type substrate processing apparatus includes, for example, a plurality of processing units. A controller included in the substrate processing apparatus makes each processing unit perform operations (processing) in accordance with a prepared schedule. At a starting time of a substrate processing step or a preliminary preparation process among the various operations performed at the respective processing units, a control load (CPU load or communication processing load) of the controller may become high due to sending/receiving of processing content data, reading of the processing content data, and data interpretation. Therefore, when a plurality of processing units are to be made to start the substrate processing step, etc., together at the same time, the processing content data are sent at the same time and the control load concentrates at the controller so that data processing cannot be performed smoothly and as a result, the start of the substrate processing step or preliminary preparation process, etc., at some processing unit may become delayed. Uniformity of substrate processing at the respective processing units thus cannot be guaranteed and a problem may occur in substrate processing results. For example, if time from carry-in into a processing unit to start of substrate processing varies, time during which a substrate is exposed to a mist inside a substrate unit becomes non-uniform. The mist may influence a surface state of a substrate and it is thus preferable for the time to the start of substrate processing to be uniform among substrates. Also, if time taken for a substrate, for which the substrate processing has ended, to be carried out from a processing unit varies, time until substrate processing can be started at a subsequent processing unit becomes non-uniform and it may not be possible to apply an effect of a preceding substrate processing to a subsequent substrate processing with stability.

When such phenomena occur, the same substrate processing effect may not be obtained even if the same recipe is applied to the respective substrates.

Although as a measure for preventing delay of start of processing, improvement of processing performance of the controller or increase of the number of controllers may be considered, such measures may lead to cost increase due to installation of a new controller. Moreover, such measures may cause consumption power to increase and the arrangement of the substrate processing apparatus to become complex. The present inventor is thus examining avoidance of concentration of control load at the controller by improvement of efficiency of data processing at the controller through design of schedule preparation.

An object of the present invention is thus to provide a schedule preparation method that enables preparation of schedules with which efficiency of data processing at a controller is improved.

Also, another object of the present invention is to provide a substrate processing apparatus capable of processing substrates while achieving improvement of efficiency of data processing at a controller.

Solution to the Problems

The present invention provides a schedule preparation method being a method, by which a schedule preparing portion included in a substrate processing apparatus, having at least one single substrate processing unit that processes one substrate at a time and a controller arranged to control the processing unit, prepares a schedule for specifying operations of the substrate processing apparatus in chronological order, and including a schedule preparation step of preparing a schedule for each substrate by positioning, in chronological order, a plurality of blocks, each specifying contents of an operation to be performed on the substrate by the substrate processing apparatus, and where the schedule preparation step includes a high load avoidance positioning step in which, in preparing the schedules for a plurality of substrates, blocks, each corresponding to a high load operation that is an operation in which a high control load occurs at least temporarily in the controller, are positioned on a time axis so that high load time slots, each being a time slot during which a high control load occurs in the controller, are not concentrated.

With the present method, the schedule preparing portion prepares the schedule for each substrate by positioning, in chronological order, the plurality of blocks, each specifying the contents of an operation to be performed on the substrate and prepares the substrate schedules for the number of substrates to be processed. In this step, the blocks corresponding to the high load operations are positioned on the time axis so that the high load time slots are not concentrated. With the thus prepared schedules, the concentrating of control load in the controller is avoided. A schedule preparation method that enables preparation of schedules with which efficiency of data processing at the controller is improved can thus be provided.

In the preferred embodiment of the present invention, each of the blocks corresponding to the high load operations has high load information added to a portion corresponding to the high load time slot, and in the high load avoidance positioning step, the blocks corresponding to the high load operations are positioned so that not less than a predetermined number of the high load information are not allocated to the same time slot in preparing the schedules for the plurality of substrates.

With the present arrangement, the schedule preparing portion positions each block corresponding to a high load operation so that not less than the predetermined number of the high load information are not allocated to the same time slot. The blocks corresponding to the high load operations can thereby be positioned reliably and easily so that the high load time slots thereof do not become concentrated.

Each of the high load time slots may be a starting time of the high load operation.

With the present method, the control load of the controller may increase at a starting time of operation of each resource due to sending/receiving of processing data or data interpretation of the processing data at the controller. That is, the starting times of the high load operations are high load time slots.

If in the schedules of the plurality of substrates, the blocks corresponding to high load operations are positioned with respect to each other on the time axis so that the high load operations are started at the same time, the control load of the controller may concentrate at the starting time of the high load operations and it may not be possible to perform data processing smoothly. Consequently, the start of operation of some resource may become delayed.

On the other hand, with the present method, the schedule preparing portion positions the blocks, corresponding to high load operations, on the time axis so that the starting times of the corresponding high load operations are not concentrated at the same time period. The concentration of control load in the controller is thus avoided and consequently, schedules with which the efficiency of data processing at the controller is improved can be prepared and delay of start of operation of a resource can thus be prevented reliably.

The high load operations may include at least one of a substrate processing step, in which the processing unit processes a substrate, a preliminary processing step, in which the processing unit performs preparation for the substrate processing step, a pre-carry-in processing step, in which the processing unit performs an operation for carrying a substrate inside the processing unit, and a substrate recovery step, in which a predetermined processing is applied to a substrate prior to recovery of the substrate from the processing unit.

The substrate processing apparatus may be arranged so that after preparation of a schedule for a predetermined first substrate among a plurality of substrates of a process job in common has ended, execution of the prepared schedule starts in a state where preparation of a schedule for a predetermined second substrate, among the plurality of substrates, for which a processing order is later than that of the first substrate, has not ended. In this case, the method may further include a schedule changing step, in which, after execution of the prepared schedule is started, a yet-to-be-executed portion of the prepared schedule is changed.

With the present method, when the preparation of the schedule for some substrate among the plurality of substrates of the process job in common has ended, the execution of the prepared schedule is started even if the preparation of the schedules for the other substrates has not ended.

For example, if, as described in Patent Literature 1, operation of a substrate processing apparatus is arranged to be started after preparation of schedules for all substrates of a process job in common has ended, an enormous amount of data must be stored in the substrate processing apparatus.

On the other hand, with the present method, it suffices to store at least the schedule of the substrate to be executed and the amount of schedule data to be stored in the substrate processing apparatus can thereby be reduced.

Also, the yet-to-be-executed portion of the prepared schedule is changed after the start of the schedule and therefore schedule contents can be changed in accordance with actual operation circumstances (substrate processing circumstances) of the substrate processing apparatus. Flexible schedule preparation in accordance with the actual operation circumstances is thus enabled.

The schedule changing step may include a step, in which, after the start of execution of the schedule, a yet-to-be-executed block in the prepared schedule is deleted, and a repositioning step, in which the deleted block is repositioned in chronological order in parallel to the positioning of blocks for the second substrate.

With the present method, the yet-to-be-executed block deleted from the prepared schedule is repositioned in chronological order in parallel to the positioning of blocks for the second substrate. The repositioning of the deleted block and the positioning of the blocks for the second substrate are performed in chronological order so that the processing of the plurality of substrates is performed without giving rise to mutual interference among the plurality of substrates and by making the resources (the processing units, etc.) operate efficiently. Positioning positions of the deleted block and the blocks for the second substrate can be determined more finely to enable improvement of operation rates of the resources and productivity of the substrate processing apparatus can thereby be improved.

Also, the present invention provides a substrate processing apparatus, including at least one single substrate processing unit that processes one substrate at a time, a controller arranged to control the processing unit, and a schedule preparing portion arranged to prepare schedules for specifying operations of a resource, including the processing unit, in chronological order, and where the controller controls the resource in accordance with the schedules that the schedule preparing portion prepared by the schedule preparation method.

With the present arrangement, the schedule preparing portion prepares a schedule for each substrate by positioning, in chronological order, a plurality of blocks, each specifying contents of an operation to be performed on the substrate, and the substrate schedules are prepared for the number of substrates to be processed. In this step, blocks corresponding to high load operations are positioned on a time axis so that high load time slots are not concentrated. With the thus prepared schedules, the concentrating of control load in the controller is avoided. The controller controls the resources in accordance with each schedule and therefore a substrate processing apparatus capable of processing substrates while achieving improvement of efficiency of data processing at the controller can thus be provided.

The controller may, after preparation of a schedule for a predetermined first substrate among a plurality of substrates of a process job in common has ended, start execution of the prepared schedule in a state where preparation of a schedule for a predetermined second substrate, among the plurality of substrates, for which a processing order is later than that of the first substrate, has not ended.

With the present arrangement, when the preparation of the schedule for some substrate has ended, the execution of the prepared schedule is started even if the preparation of the schedules for the other substrates has not ended. An amount of schedule data to be stored in the substrate processing apparatus can therefore be reduced.

The foregoing and other objects, features and advantages of the present invention will become more apparent from the description of preferred embodiments provided below with reference to the accompanying drawings.

BRIEF DESCRIPTION OF THE DRAWINGS

FIG. 4D is a flowchart for describing the preferred embodiment of the present invention and shows the example of processing by the scheduling function portion.

FIG. 24 shows an entirety of schedules for a plurality of substrates that are prepared by the scheduling function portion.

FIG. 25A shows a first modification example of schedule preparation.

FIG. 25B shows a data flow until a start of substrate processing.

FIG. 26 shows a second modification example of schedule preparation.

PREFERRED EMBODIMENTS OF THE INVENTION

Figure 1:
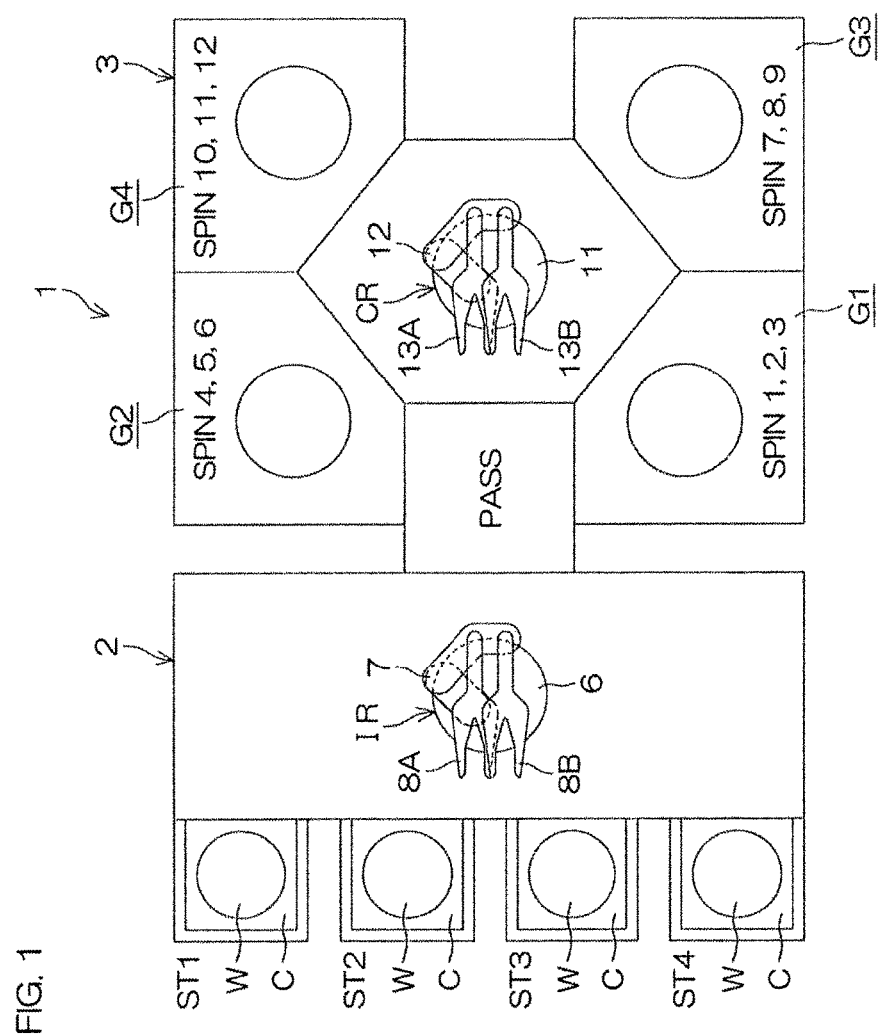
FIG. 1 is an illustrative plan view of a layout of a substrate processing apparatus according to a preferred embodiment of the present invention.
Figure 2:
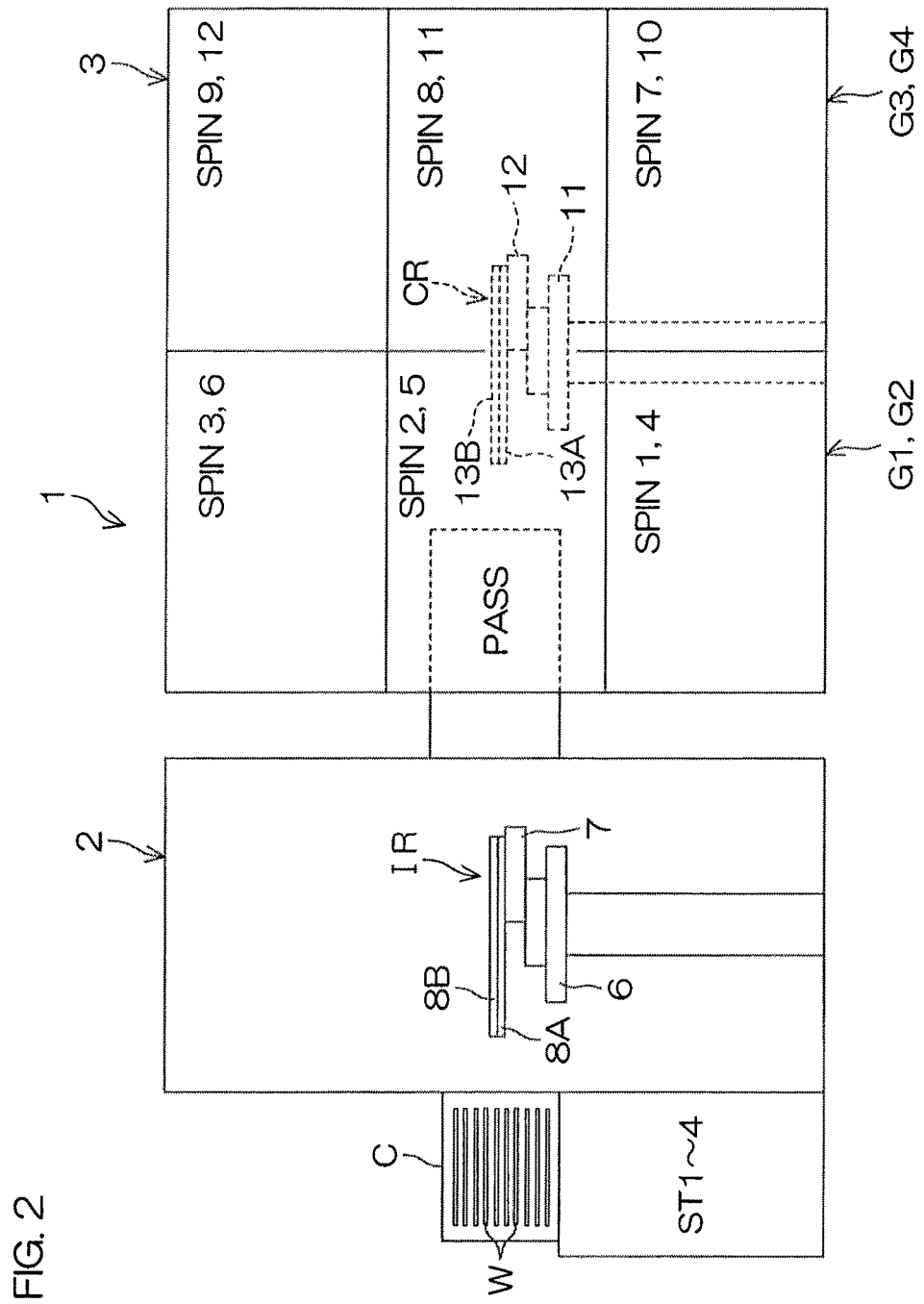
FIG. 2 is an illustrative side view of the substrate processing apparatus.
Figure 3A:
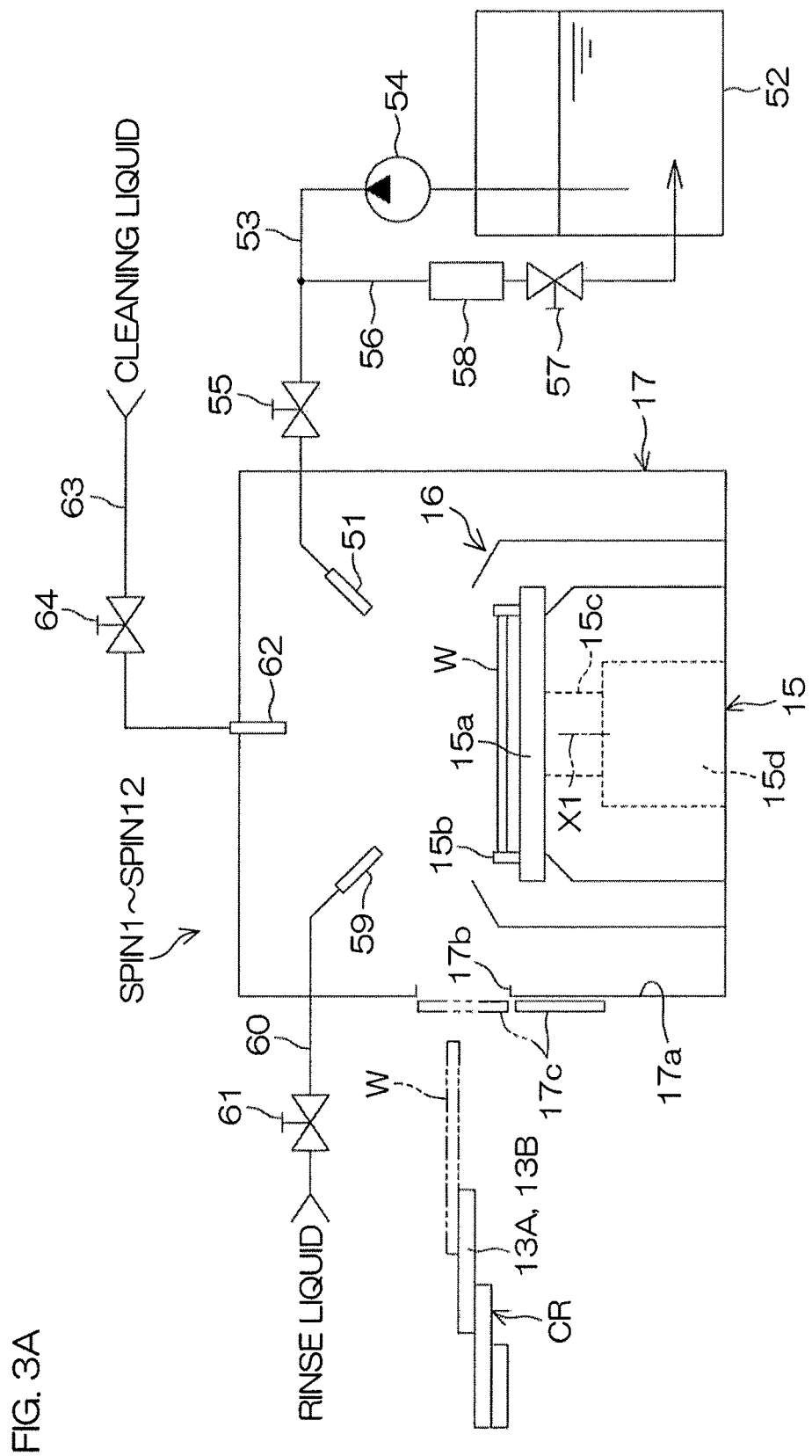
FIG. 3A is a schematic view of an interior of each of processing units, included in the substrate processing apparatus, as viewed in a horizontal direction.

FIG. 1 is an illustrative plan view of a layout of a substrate processing apparatus 1 according to a preferred embodiment of the present invention, and FIG. 2 is an illustrative side view of the same. FIG. 3A is a schematic view of an interior of each of processing units SPIN1 to SPIN12, included in the substrate processing apparatus 1, as viewed in a horizontal direction.

The substrate processing apparatus 1 includes an indexer section 2 and a processing section 3. The processing section 3 includes a receiving/passing unit PASS for receiving and passing of a substrate W with respect to the indexer section 2. The indexer section 2 passes an unprocessed substrate W to the receiving/passing unit PASS and receives a processed substrate W from the receiving/passing unit PASS. The processing section 3 receives the unprocessed substrate W from the receiving/passing unit PASS and performs various types of processing, such as processing using a processing agent (a processing liquid or a processing gas), processing using electromagnetic waves, such as ultraviolet rays, etc., physical cleaning processing (brush cleaning, spray nozzle cleaning, etc.), etc., on the substrate W. The processing section 3 then passes the processed substrate W to the receiving/passing unit PASS.

The indexer section 2 includes a plurality of stages ST1 to ST4 and an indexer robot IR.

Each of the stages ST1 to ST4 is a substrate container holding portion capable of holding a substrate container C that contains a plurality of substrates W (for example, semiconductor wafers) in a stacked state. The substrate container C may be an FOUP (front opening unified pod) that contains the substrates W in a sealed state, an SMIF (standard mechanical interface) pod, or an OC (open cassette), etc. For example, when substrate containers C are placed on the stages ST1 to ST4, a plurality of substrates W in horizontal orientations are stacked across intervals from each other in a vertical direction in each substrate container C.

The indexer robot IR includes, for example, a base portion 6, an articulated arm 7, and a pair of hands 8A and 8B. The base portion 6 is, for example, fixed to a frame of the substrate processing apparatus 1. The articulated arm 7 is arranged by a plurality of arm portions, which are pivotable along a horizontal plane, being pivotably coupled to each other, and is arranged to flex and extend by change of angles between arm portions at joint portions that are the coupling locations of the arm portions. A base end portion of the articulated arm 7 is coupled to the base portion 6 so as to be capable of pivoting around a vertical axis. Further, the articulated arm 7 is coupled to the base portion 6 so as to be capable of being elevated and lowered with respect thereto. In other words, the base portion 6 incorporates an elevating/lowering drive mechanism that elevates and lowers the articulated arm 7 and a pivoting drive mechanism that pivots the articulated arm 7 around the vertical axis. Also, the articulated arm 7 includes an individual pivoting drive mechanism that pivots each arm portion individually. Each of the hands 8A and 8B is coupled to a tip portion of the articulated arm 7 so as to be capable of pivoting individually around a vertical axis and advancing and retreating individually in the horizontal direction. The articulated arm 7 includes a hand pivoting drive mechanism arranged to pivot each of the hands 8A and 8B individually around the vertical axis, and a hand advancing/retreating mechanism arranged to advance and retreat each of the hands 8A and 8B individually in the horizontal direction. Each of the hands 8A and 8B is arranged, for example, to be capable of holding a single substrate W. Although the hands 8A and 8B may be disposed in a vertically overlapped state, in FIG. 1, the hands 8A and 8B are shown to be shifted in a direction parallel to the plane of paper (horizontal direction) for the sake of clarity.

With the present arrangement, the indexer robot IR operates so that the hand 8A carries out a single unprocessed substrate W from the substrate container C held by one of the stages ST1 to ST4 and passes it to the receiving/passing unit PASS. Further, the indexer robot IR operates so that the hand 8B receives a single processed substrate W from the receiving/passing unit PASS and then houses it in a substrate container C held by one of the stages ST1 to ST4.

The processing section 3 includes a plurality (twelve, in the present preferred embodiment) of processing units SPIN1 to SPIN12, a main transfer robot CR, and the above-described receiving/passing unit PASS.

The processing units SPIN1 to SPIN12 are disposed three-dimensionally in the present preferred embodiment. More specifically, the plurality of processing units SPIN1 to SPIN12 are disposed so as to constitute a three-tiered structure, with four processing units being disposed at each tier. That is, the four processing units SPIN1, SPIN4, SPIN7, and SPIN10 are disposed at a first tier portion, another four processing units SPIN2, SPIN5, SPIN8, and SPIN11 are disposed at a second tier portion, and yet other processing units SPIN3, SPIN6, SPIN9 and SPIN12 are disposed at a third tier portion. Even more specifically, the main transfer robot CR is disposed at a center of the processing section 3 in plan view, and the receiving/passing unit PASS is disposed between the main transfer robot CR and the indexer robot IR. A first processing unit group G1, in which the three processing units SPIN1 to SPIN3 are stacked, and a second processing unit group G2, in which another three processing units SPIN4 to SPIN6 are stacked, are disposed so as to face each other across the receiving/passing unit PASS. A third processing unit group G3, in which the three processing units SPIN7 to SPIN9 are stacked, is disposed so as to be adjacent to the first processing unit group G1 at a side further from the indexer robot IR. Similarly, a fourth processing unit group G4, in which the three processing units SPIN10 to SPIN12 are stacked, is disposed so as to be adjacent to the second processing unit group G2 at a side further from the indexer robot IR. The main transfer robot CR is surrounded by the first to fourth processing unit groups G1 to G4.

The main transfer robot CR includes, for example, a base portion 11, an articulated arm 12, and a pair of hands 13A and 13B. The base portion 11 is fixed, for example, on the frame of the substrate processing apparatus 1. The articulated arm 12 is arranged by a plurality of arm portions, extending along a horizontal plane, being pivotably coupled to each other, and is arranged to flex and extend by change of angles between arm portions at joint portions that are the coupling locations of the arm portions. A base end portion of the articulated arm 12 is coupled to the base portion 11 so as to be capable of rotating around a vertical axis. Further, the articulated arm 12 is coupled to the base portion 11 so as to be capable of being elevated and lowered with respect thereto. In other words, the base portion 11 incorporates an elevating/lowering drive mechanism that elevates and lowers the articulated arm 12 and a pivoting drive mechanism that pivots the articulated arm 12 around the vertical axis. Also, the articulated arm 12 includes an individual pivoting drive mechanism that pivots each arm portion individually. Each of the hands 13A and 13B is coupled to a tip portion of the articulated arm 12 so as to be capable of pivoting individually around a vertical axis and advancing and retreating individually in the horizontal direction. The articulated arm 12 includes a hand pivoting drive mechanism for pivoting each of the hands 13A and 13B individually around the vertical axis, and a hand advancing/retreating mechanism for advancing and retreating each of the hands 13A and 13B individually in the horizontal direction. Each of the hands 13A and 13B is arranged, for example, to be capable of holding a single substrate W. Although the hands 13A and 13B may be disposed in a vertically overlapped state, in FIG. 1, the hands 13A and 13B are shown to be shifted in a direction parallel to the plane of paper (horizontal direction) for the sake of clarity.

With the present arrangement, the main transfer robot CR receives, by the hand 13A, a single unprocessed substrate W from the receiving/passing unit PASS and carries the unprocessed substrate W into one of the processing units SPIN1 to SPIN12. Also, the main transfer robot CR receives, by the hand 13B, a processed substrate W processed at one of the processing units SPIN1 to SPIN12 and passes the substrate W to the receiving/passing unit PASS.

Each of the processing units SPIN1 to SPIN12 is a single substrate processing type processing unit that processes the substrates W one at a time. Each of the processing units SPIN1 to SPIN12 may be a liquid processing unit, supplying a processing liquid to the substrate W, a gas processing unit, performing processing using a processing gas, an electromagnetic wave processing unit, performing processing using electromagnetic waves, such as ultraviolet rays, etc., or a physical cleaning process unit, performing a physical cleaning processing (brush cleaning, spray nozzle cleaning, etc.), and supplies the processing liquid or performs the processing while rotating the substrate W around a vertical axis passing through a central portion of the substrate W. FIG. 3A shows an example where the processing units SPIN1 to SPIN12 are liquid processing units.

As shown in FIG. 3A, each of the processing units SPIN1 to SPIN12 includes a box-shaped processing chamber 17 having an internal space, a spin chuck 15 holding a single substrate W in a horizontal orientation inside the processing chamber 17 and rotating the substrate W around a vertical rotational axis X1 passing through a central portion of the substrate W, and a cylindrical processing cup 16 surrounding the spin chuck 15 around the rotational axis X1 of the substrate W.

The processing chamber 17 is partitioned by a box-shaped partition wall 17a. An opening 17b for carrying in and out a substrate W to and from the interior of processing chamber 17 is formed in the partition wall 17a. The opening 17b is opened and closed by a shutter 17c. The shutter 17c is elevated and lowered, by a shutter elevating/lowering mechanism (not shown), between a closed position (indicated by alternate long and two short dashes lines in FIG. 3A) of covering the opening 17b and an open position (indicated by solid lines in FIG. 3A) of opening the opening 17b.

In carrying in and out a substrate W, the main transfer robot CR makes the hands 13A and 13B access the interior of the processing chamber 17 through the opening 17b. An unprocessed substrate W can thereby be placed above the spin chuck 15 or a processed substrate W can be removed from the spin chuck 15.

As shown in FIG. 3A, the spin chuck 15 includes a disk-shaped spin base 15a taking on a horizontal orientation, a plurality of chuck pins 15b projecting upward from an upper surface outer peripheral portion of the spin base 15a, a chuck opening/closing mechanism pressing the plurality of chuck pins 15b against a peripheral edge portion of a substrate W, a rotating shaft 15c extending downward from a central portion of the spin base 15a, and a spin motor 15d rotating the rotating shaft 15c to rotate the substrate W held by the plurality of chuck pins 15b. The spin chuck 15 is not restricted to the clamping type chuck shown in FIG. 3A and may be a vacuum type chuck that holds a substrate in a horizontal orientation by suction of a lower surface of the substrate onto an upper surface of a spin base.

As shown in FIG. 3A, each of the processing units SPIN1 to SPIN12 includes a chemical liquid nozzle 51 discharging a chemical liquid toward an upper surface of the substrate W held by the spin chuck 15, a chemical liquid tank 52 storing the chemical liquid supplied to the chemical liquid nozzle 51, a chemical liquid piping 53 guiding the chemical liquid inside the chemical liquid tank 52 to the chemical liquid nozzle 51, a liquid delivery apparatus 54 (for example, a pump) that delivers the chemical liquid inside the chemical liquid tank 52 into the chemical liquid piping 53, and a chemical liquid valve 55 opening and closing the interior of the chemical liquid piping 53. Each of the processing units SPIN1 to SPIN12 further includes a circulation piping 56 connecting the chemical liquid piping 53 and the chemical liquid tank 52 at a position further upstream (to the chemical liquid tank 52 side) than the chemical liquid valve 55, a circulation valve 57 opening and closing the interior of the circulation piping 56, and a temperature adjusting apparatus 58 adjusting a temperature of the chemical liquid flowing through the circulation piping 56.

Figure 3B:
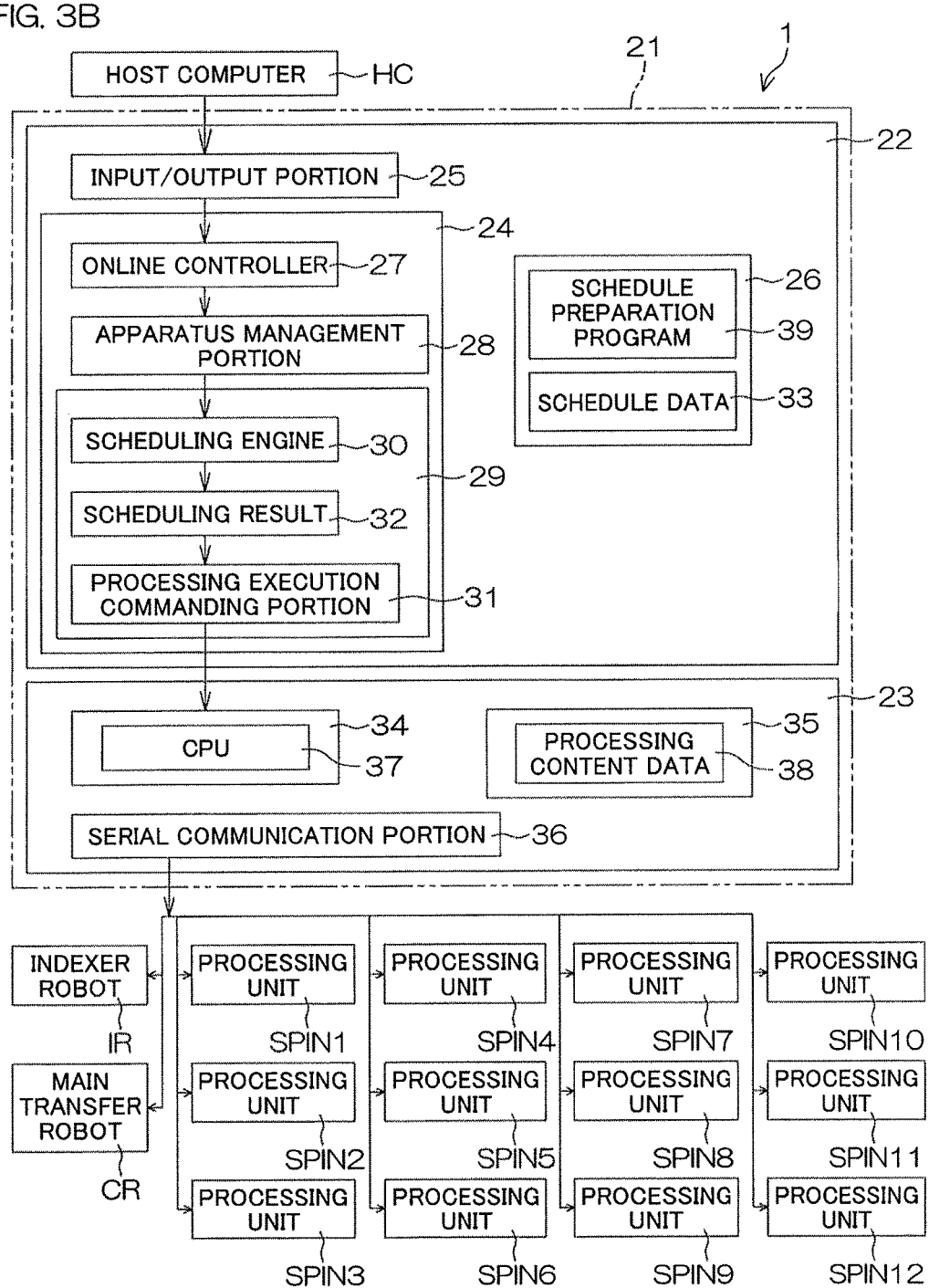
FIG. 3B is a block diagram for describing an electrical arrangement of the substrate processing apparatus.

The opening and closing of the chemical liquid valve 55 and the circulation valve 57 are controlled by a computer 21 (see FIG. 3B). When the chemical liquid inside the chemical liquid tank 52 is to be supplied to the chemical liquid nozzle 51, the chemical liquid valve 55 is opened and the circulation valve 57 is closed. In this state, the chemical liquid delivered to the chemical liquid piping 53 from the chemical liquid tank 52 by the liquid delivery apparatus 54 is supplied to the chemical liquid nozzle 51. On the other hand, when the supply of the chemical liquid to the chemical liquid nozzle 51 is to be stopped, the chemical liquid valve 55 is closed and the circulation valve 57 is opened. In this state, the chemical liquid delivered to the chemical liquid piping 53 from the chemical liquid tank 52 by the liquid delivery apparatus 54 is returned to the chemical liquid tank 52 through the circulation piping 56. Therefore, during supply stoppage, in which the supply of the chemical liquid to the chemical liquid nozzle 51 is stopped, the chemical liquid is continuously circulated in a circulation path constituted by the chemical liquid tank 52, the chemical liquid piping 53, and the circulation piping 56. The temperature adjusting apparatus 58 adjusts the temperature of the chemical liquid flowing inside the circulation piping 56. Therefore, during the supply stoppage, the chemical liquid inside the chemical liquid tank 52 is heated in the circulation path and maintained at a higher temperature than room temperature.

Further, the chemical liquid valve 55 is enabled to be finely adjusted in opening degree to enable a minute amount of the chemical liquid to be discharged from the chemical liquid nozzle 51 to perform pre-dispensing. Also, a chemical liquid recovery member (not shown) is disposed near the chemical liquid nozzle 51 to enable recovery of the chemical liquid pre-dispensed from the chemical liquid nozzle 51.

Also, as shown in FIG. 3A, each of the processing units SPIN1 to SPIN12 includes a rinse liquid nozzle 59 discharging a rinse liquid toward the upper surface of the substrate W held by the spin chuck 15, a rinse liquid piping 60 supplying the rinse liquid from a rinse liquid supply source (not shown) to the rinse liquid nozzle 59, and a rinse liquid valve 61 switching between supplying and stopping the supplying of the rinse liquid from the rinse liquid piping 60 to the rinse liquid nozzle 59. DIW (deionized water), etc., is used as the rinse liquid. After supplying the chemical liquid to the substrate W by the chemical liquid nozzle 51, the chemical liquid attached to the substrate W can be rinsed off by supplying the rinse liquid from the rinse liquid nozzle 59 to the substrate W.

Further, each of the processing units SPIN1 to SPIN12 includes a cleaning liquid nozzle 62 arranged to discharge a cleaning liquid toward a predetermined location (for example, the spin base 15a) in the interior of the processing chamber 17, a cleaning liquid piping 63 supplying the cleaning liquid from a cleaning liquid supply source (not shown) to the cleaning liquid nozzle 62, and a cleaning liquid valve 64 switching between supplying and stopping the supplying of the cleaning liquid from the cleaning liquid piping 63 to the cleaning liquid nozzle 62. DIW (deionized water), etc., is used as the cleaning liquid. The cleaning liquid nozzle 62 is mounted to an inner wall of the processing chamber 17. In a state where a dummy substrate (not shown; cleaning jig) or a substrate W is held by the plurality of chuck pins 15b, the spin base 15a and the chuck pins 15b are rotated and the cleaning liquid is discharged from the cleaning liquid nozzle 62. The cleaning liquid discharged from the cleaning liquid nozzle 62 splashes on an upper surface of the dummy substrate or the upper surface of the substrate W held by the chuck pins 15b so that the cleaning liquid becomes scattered inside processing chamber 17. Various parts (the chuck pins 15b and the processing cup 16) disposed inside the processing chamber 17 can be cleaned by thus scattering the cleaning liquid.

FIG. 3B is a block diagram for describing the electrical arrangement of the substrate processing apparatus 1. The substrate processing apparatus 1 includes a computer 21 that controls the processing units SPIN1 to SPIN12, the main transfer robot CR, and the indexer robot.

The computer 21 includes a main controller 22 and sub-controller 23.

The main controller 22 may be in the form of a personal computer (FA personal computer) and includes a first controller 24, an input/output portion 25, and a first storage portion 26. The first controller 24 includes a computing unit, such as a CPU, etc. The input/output portion 25 includes output equipment, such as a display unit, etc., and input equipment, such as a keyboard, a pointing device, a touch panel, etc. The input/output portion 25 further includes a communication module arranged to communicate with a host computer HC. The first storage portion 26 includes a storage device, such as a solid-state memory device, a hard-disk drive, etc.

The first controller 24 includes an online controller 27, an apparatus management portion 28, and a scheduling function portion (schedule preparing portion) 29. The scheduling function portion 29 includes a scheduling engine 30 and a processing execution commanding portion 31. The scheduling engine 30 prepares a schedule (plan) by which resources of the substrate processing apparatus 1 are actuated in chronological order to make a substrate W be carried out from a substrate container C, be processed by any of the processing units SPIN1 to SPIN12, and thereafter be housed in the substrate container C. A result of schedule preparation (scheduling result 32) by the scheduling engine 30 is provided to the processing execution commanding portion 31. In accordance with the provided schedule, the processing execution commanding portion 31 sends commands for actuating the resources of the substrate processing apparatus 1 to the sub-controller 23.

The first storage portion 26 is arranged to store data, etc., including a schedule preparation program 39, arranged to make the first controller 24 actuate as the scheduling function portion, and schedule data 33, prepared by the scheduling function portion.

The sub-controller 23 is arranged, for example, by a control VME (VERSA Module Eurocard) board and includes a second controller 34, a second storage portion 35, and a serial communication portion 36. The second controller 34 includes a CPU 37 that executes a computational process. The second controller 34 corresponds to being a "controller" of the claims.

The second storage portion 35 is arranged to store various data, etc., including processing content data 37, which are data of contents of processing by the substrate processing apparatus 1. The processing content data 38 include process job codes assigned to the respective substrates W and recipes associated with the process job codes.

The recipe is a set of data that defines substrate processing contents including a substrate processing condition and a substrate processing procedure. More specifically, the recipe includes parallel processing unit information, usable processing liquid information, processing time information, post-processing execution condition, preliminary preparation execution condition, etc.

The "parallel processing unit information" is information that designates processing units capable of executing the substrate processing included in the recipe and expresses that parallel processing by the designated processing units is possible. In other words, this information expresses that when one of the designated processing units cannot be used, substitution by another designated processing unit is possible. "Cannot be used" refers to a state where the processing unit is being used for the processing of another substrate W, a state where the processing unit is malfunctioning, a state where an operator desires not to process the substrate W by the processing unit, etc.

The "usable processing liquid information" is information related to the processing liquids (the various chemical liquids and the rinse liquid) used in the substrate processing included in the recipe.

The "processing time information" is information related to time required for execution of each of the processes included in the recipe. Specifically, the information includes staying time of the substrate in the designated processing unit of the recipe and time required for execution of preliminary processing steps (preliminary preparation process and post-processing process) described below. That is, the preliminary processing steps are processing preparing for a substrate processing step before execution of the substrate processing at a predetermined processing unit so that the substrate processing can be executed with precision and, in the present preferred embodiment, correspond to the preliminary preparation process executed before the substrate processing and the post-processing process executed after the immediately prior substrate processing.

The "preliminary preparation execution condition" is information related to the preliminary preparation process.

The preliminary preparation process is a preliminary preparation operation that is to be executed at a processing unit before execution of a predetermined substrate processing.

For example, as described above using FIG. 3A, each of the processing units SPIN1 to SPIN12 is provided with the temperature adjusting apparatus 58 for discharging a predetermined chemical liquid at a defined temperature toward a substrate W. Although the chemical liquid is required to be discharged at the target temperature defined in the recipe toward the substrate W, a fixed time is required for the temperature adjusting apparatus 58 to heat the chemical liquid to the target temperature. The liquid delivery apparatus 54 may thus be actuated in a state where the circulation valve 57 is opened and the temperature adjusting apparatus 58 is actuated to circulate the chemical liquid inside the circulation piping 56 from before the chemical liquid is discharged from the chemical liquid nozzle 51 toward the substrate W (Preliminary Preparation Process Example 1).

Also, if chemical liquid that has fallen outside the target temperature range remains in at least one of either the chemical liquid nozzle 51 or the chemical liquid piping 53, chemical liquid of a temperature outside the target temperature may be discharged toward the substrate W. Therefore, so-called pre-dispensing, by which a small amount of the chemical liquid is released from the chemical liquid nozzle 51 from a predetermined time before actually starting the chemical liquid discharge, may be executed (Preliminary Preparation Process Example 2).

In the preliminary preparation execution condition are described such specific contents of the preliminary preparation process as what preliminary preparations (for example, the opening of the circulation valve 57, the actuation of the temperature adjusting apparatus 58 and the liquid delivery apparatus 54, the temperature adjustment at the predetermined set temperature by the temperature adjusting apparatus 58, etc., in the case of performing Preliminary Preparation Process Example 1) are to be started at which timing (for example, a predetermined time before starting the substrate processing) (for example, a predetermined time before starting the substrate processing in the allocated processing unit or a predetermined time before the chemical liquid is actually discharged from the chemical liquid nozzle 51), etc.

Further, information related to whether or not the preliminary preparation process is required is also described in the preliminary preparation execution condition.

Whether or not the preliminary preparation process is required is determined from the contents of the substrate processing, the contents of the substrate processing executed prior to the substrate processing, etc. The following example is given as an example of whether or not the preliminary preparation process is required. For example, if substrate processing using a processing liquid that is high in temperature dependence is to be executed, it is considered necessary to perform the pre-dispensing process as the preliminary preparation process and therefore the execution of the preliminary preparation process is set to "required." On the other hand, if substrate processing using a processing liquid that is low in temperature dependence is to be executed, the pre-dispensing process is unnecessary and therefore the execution of the preliminary preparation process is set to "not required." The contents of the preliminary preparation process and whether or not it is required are defined according to each process job.

Also, if substrate processing requiring preliminary preparation process is to be executed successively, as a rule, there is no need to execute the preliminary preparation process before each of the second and subsequent substrate processing at the same processing unit. However, even when the preliminary preparation process is executed for a prior substrate processing, if, due to an apparatus abnormality, etc., a long amount of time elapses before the subsequent substrate processing step is started, it may be judged that the preliminary preparation process is required.

The "post-processing execution condition" is information related to the post-processing process.

The post-processing process is an operation that is to be executed at any of the processing units SPIN1 to SPIN12 after execution of the predetermined substrate processing.

The post-processing execution condition includes information related to the specific contents of the post-processing process and information related to whether or not the post-processing process is required. Whether or not the post-processing process is required and the contents of the post-processing process are defined according to each block included in the recipe.

A specific example of the post-processing process is a cleaning processing of the interior of the processing chamber 17 of any of the processing units SPIN1 to SPIN12 (chamber cleaning process). By executing the cleaning of the interior of the processing chamber 17 (see FIG. 3A), imparting of influences of substrate processing of a prior substrate W on a substrate W that is subsequently carried into the processing chamber 17 can be avoided. Precise substrate processing can thereby be realized and the substrate processing quality can be maintained. The post-processing process is not restricted to the cleaning process (chamber cleaning process) and may be cleaning of the chuck pins holding the substrate (chuck pin cleaning process) or a cleaning processing of other parts (for example, the processing cup 16 (see FIG. 3A)) inside the processing chamber 17 (parts cleaning process) and may include two or more of these cleaning processes. The chamber cleaning and the parts cleaning may be executed by discharging the cleaning liquid from the cleaning liquid nozzle 62 (see FIG. 3A).

In the post-processing execution condition is described information related to whether or not the post-processing process is required. Whether or not the post-processing process is required is defined according to each block included in the recipe.

Whether or not the post-processing process is required is determined from the contents of the substrate processing, the contents of the substrate processing executed prior to the substrate processing, the contents of the substrate processing executed immediately after the substrate processing, etc. The following example is given as an example of whether or not the post-processing process is required. If substrate processing with a high possibility of contaminating the processing chamber 17 is to be performed, the post-processing process is set to "required" regardless of whether or not substrate processing is performed subsequently. Also, for example, if a predetermined time elapses or a predetermined number of substrates W are processed without the post-processing process being executed in the same processing chamber 17, the post-processing process is set to "required." Further, if there is a possibility of imparting influence on substrate processing performed immediately after in the same processing chamber 17, the post-processing process must be executed after the substrate processing and therefore "required" is set. Oppositely, if the substrate processing does not impart an influence on the immediately subsequent substrate processing, as in a case where just the same processing liquid is used in the immediately prior substrate processing, etc., there is no need to perform the post-processing process after the substrate processing and therefore "not required" is set.

A process job refers to one or a plurality of substrates W to which a processing in common is applied. A process job code is identification information for identifying the process job. That is, a plurality of substrates W that are assigned a process job code in common are subject to a processing in common in accordance with a recipe corresponding to the process job code. However, processing contents (recipes) corresponding to different process job codes may also happen to be the same. For example, when a processing in common is applied to a plurality of substrates W that are consecutive in processing order (order of dispensing from a substrate container C (see FIG. 1, etc.)), a process job code in common is assigned to the plurality of substrates W.

Preparation and storage of the processing content data 38 are performed by operation by an operator prior to the substrate processing at the substrate processing apparatus 1. Specifically, the first controller 24 generates a process job and a recipe based on information input by an operator by operation of the input/output portion 25. The generated processing content data 38 (process job and recipe) are provided to the sub-controller 23 and stored in the second storage portion 35.

The serial communication portion 36 performs serial communication among the processing units SPIN1 to SPIN12, the main transfer robot CR, and the indexer robot IR.

The sub-controller 23 may be arranged by the same computer as the main controller 22 or may be arranged by a different computer from the main controller 22.

When a substrate container C is carried into the substrate processing apparatus 1, the host computer HC sends a process job generating command to the main controller 22. A process job code and recipe identification information are included in the process job generating command.

Each process job includes the recipe identification information designated by the process job generating command. The second controller 34 selects the recipe corresponding to the recipe identification information designated by the process job generating command from among a plurality of recipes stored in the second storage portion 35 and reads the selected recipe. The recipe corresponding to the process job is thereby prepared by the sub-controller 23.

Figure 4A:
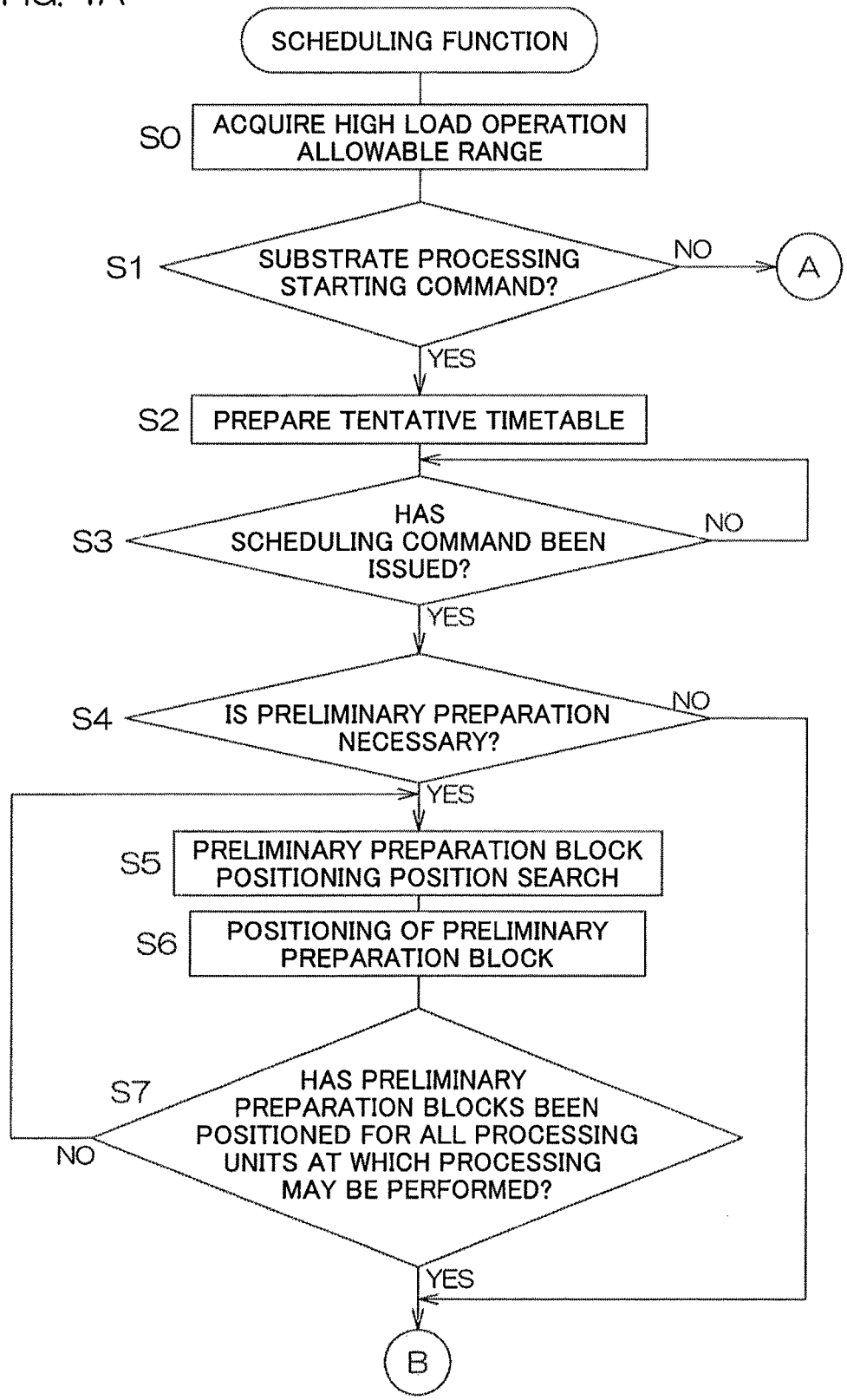
FIG. 4A is a flowchart for describing a preferred embodiment of the present invention and shows an example of processing by a scheduling function portion.
Figure 4B:
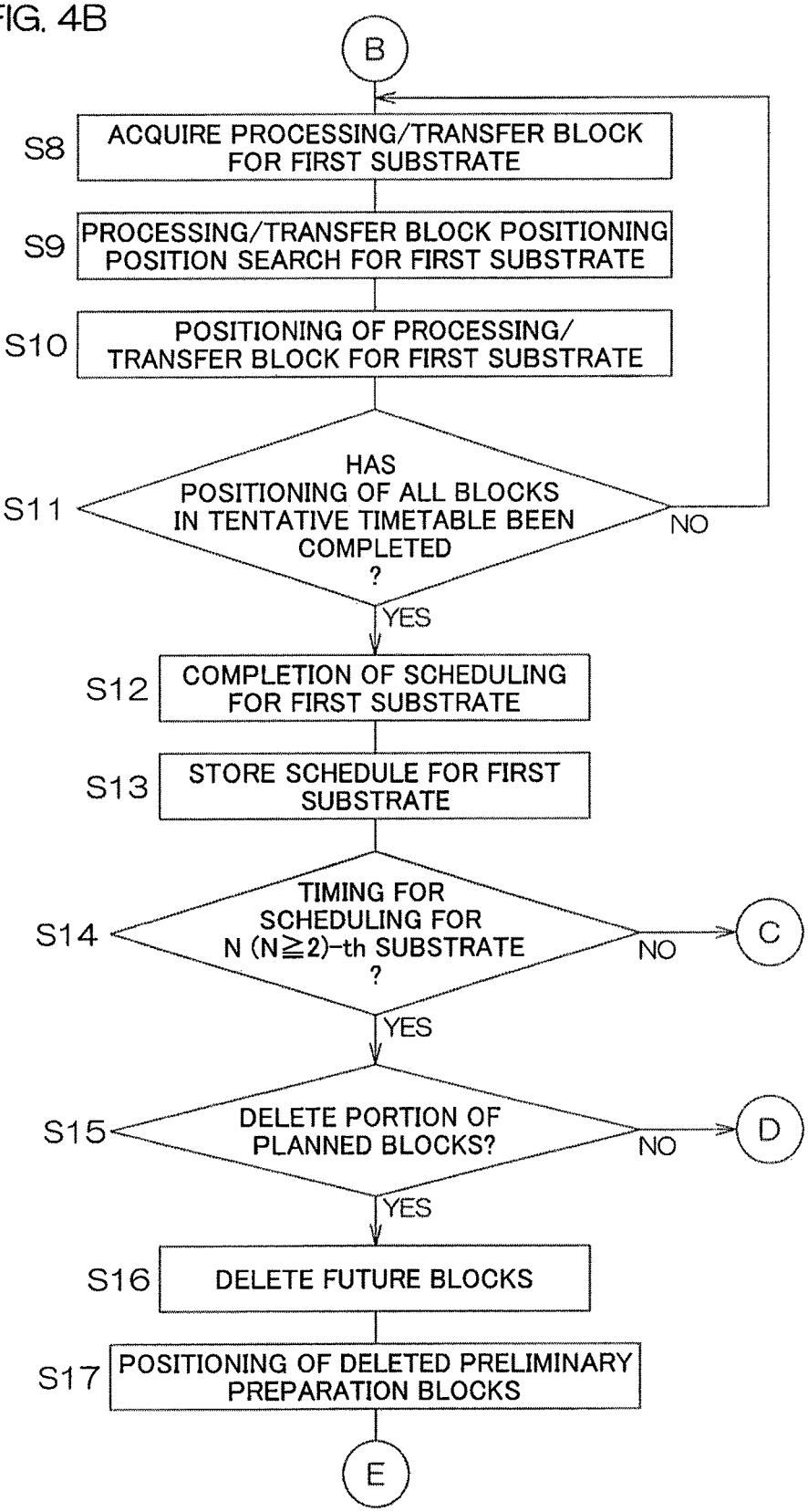
FIG. 4B is a flowchart for describing the preferred embodiment of the present invention and shows the example of processing by the scheduling function portion.
Figure 4C:
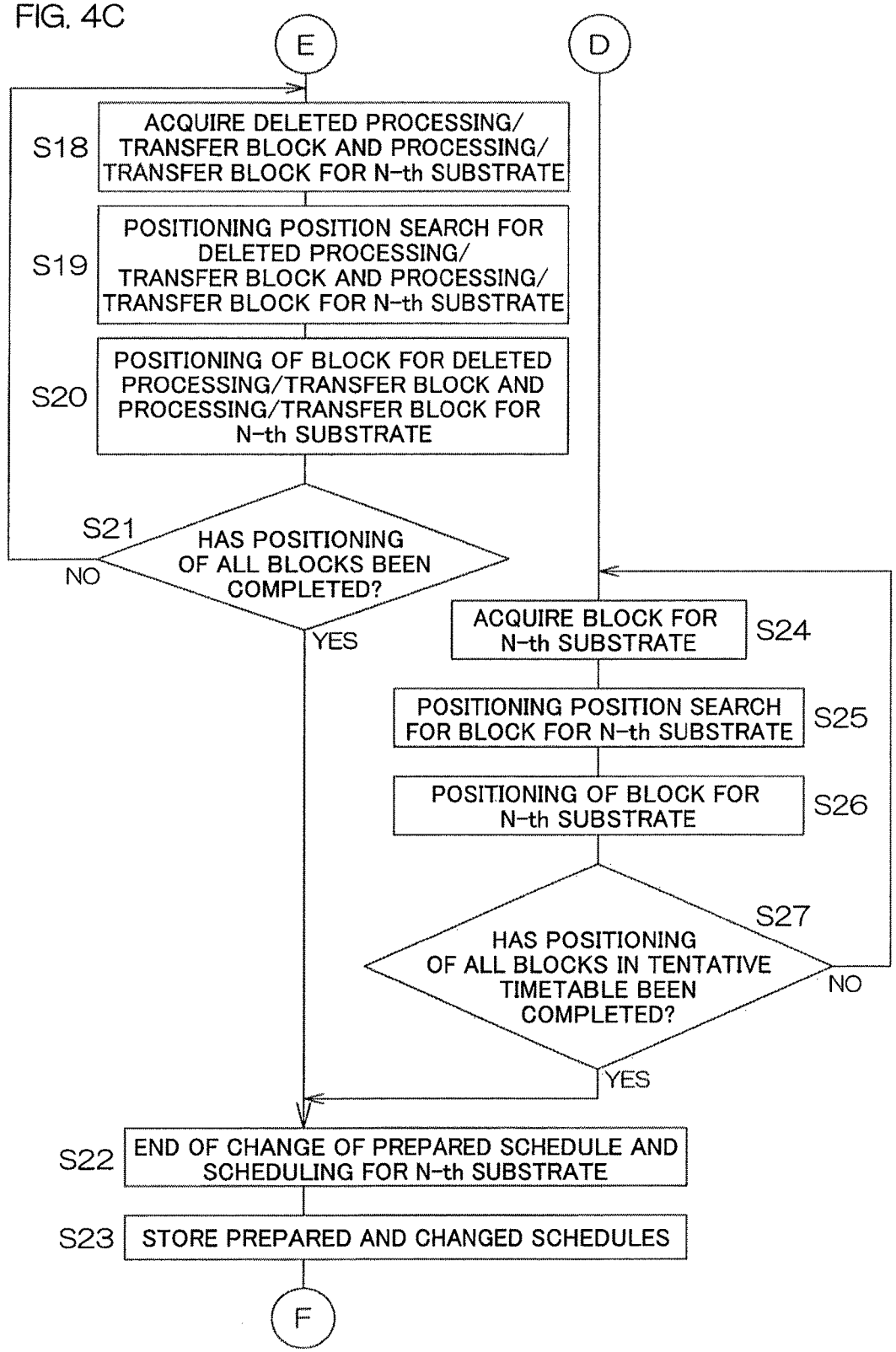
FIG. 4C is a flowchart for describing the preferred embodiment of the present invention and shows the example of processing by the scheduling function portion.
Figure 5:
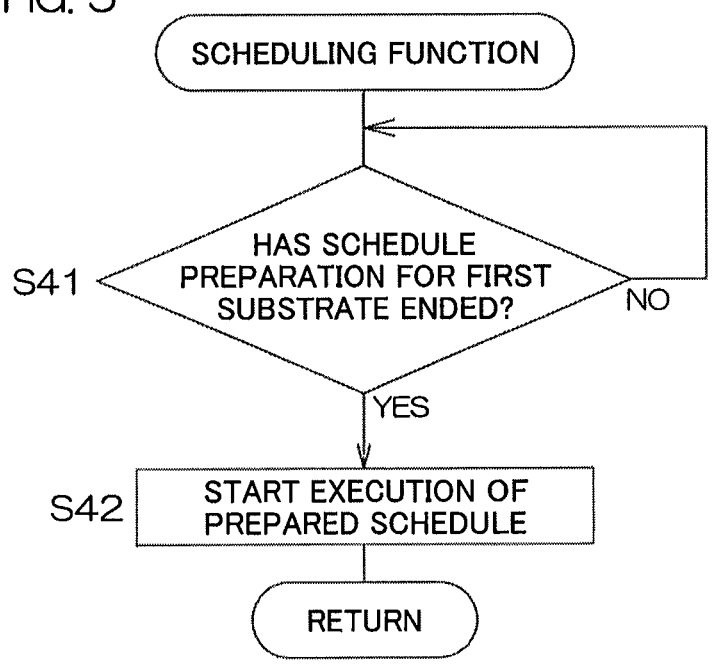
FIG. 5 is a flowchart for describing the preferred embodiment of the present invention and shows an example of processing by the scheduling function portion.
Figure 6:
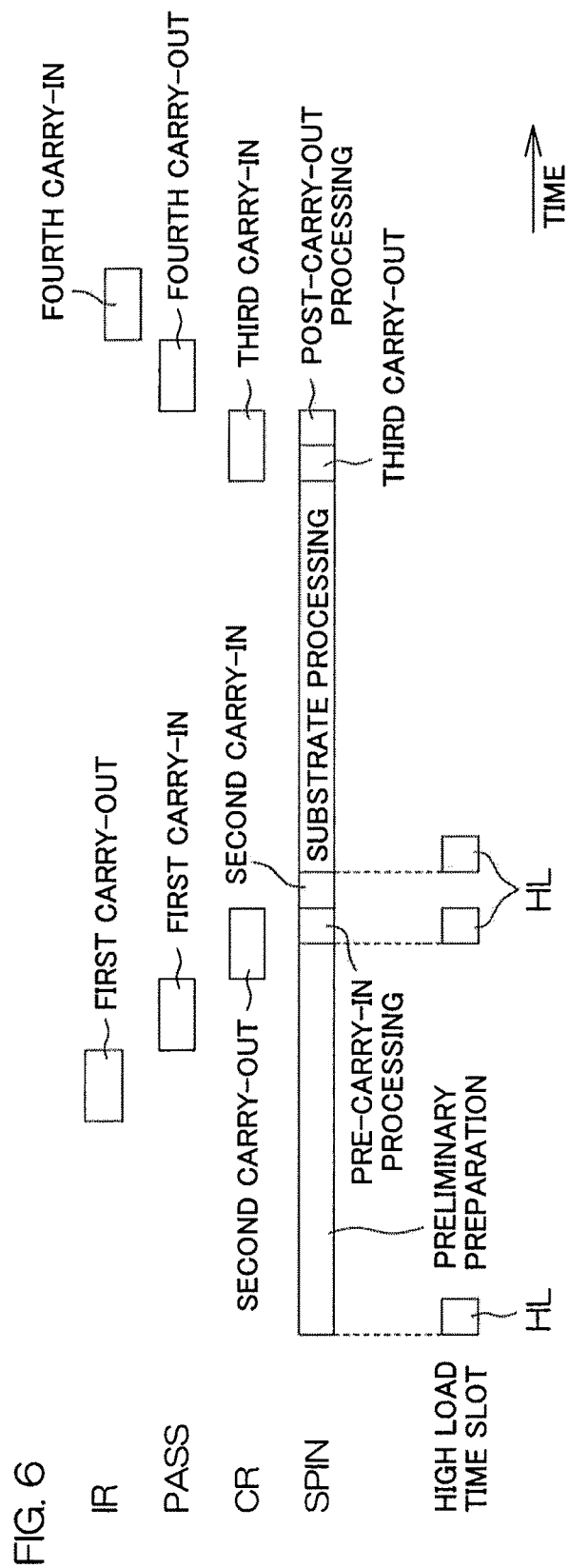
FIG. 6 shows an example of a tentative timetable.
Figure 7:
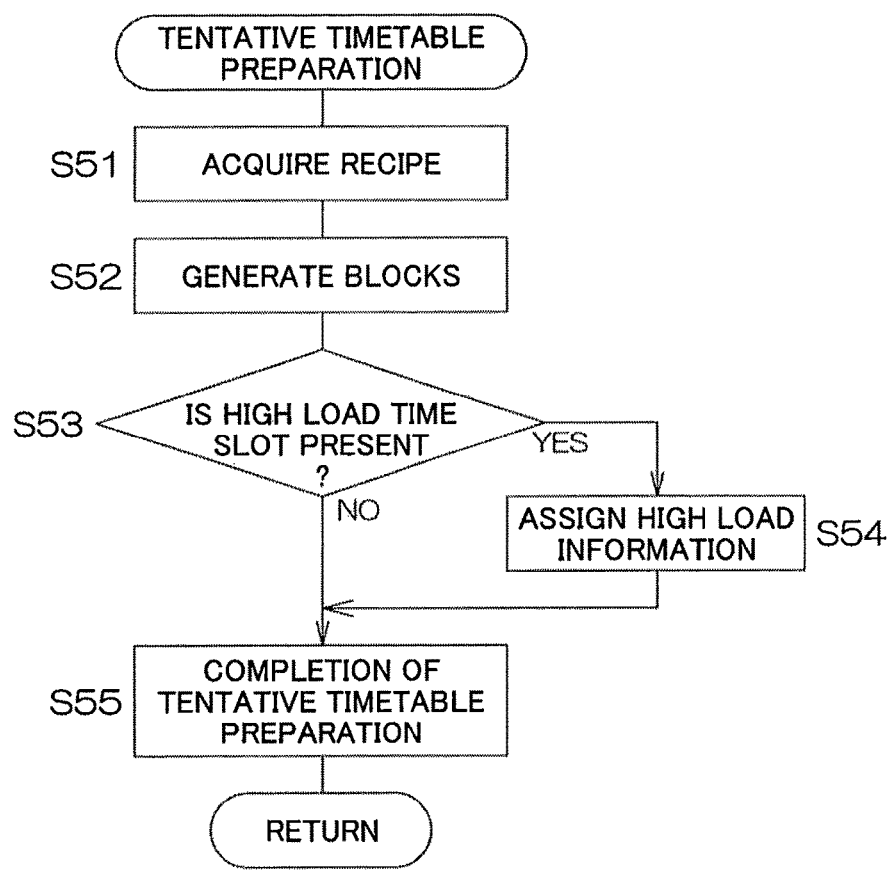
FIG. 7 is a flowchart of a flow of a tentative timetable preparation processing.
Figure 8:
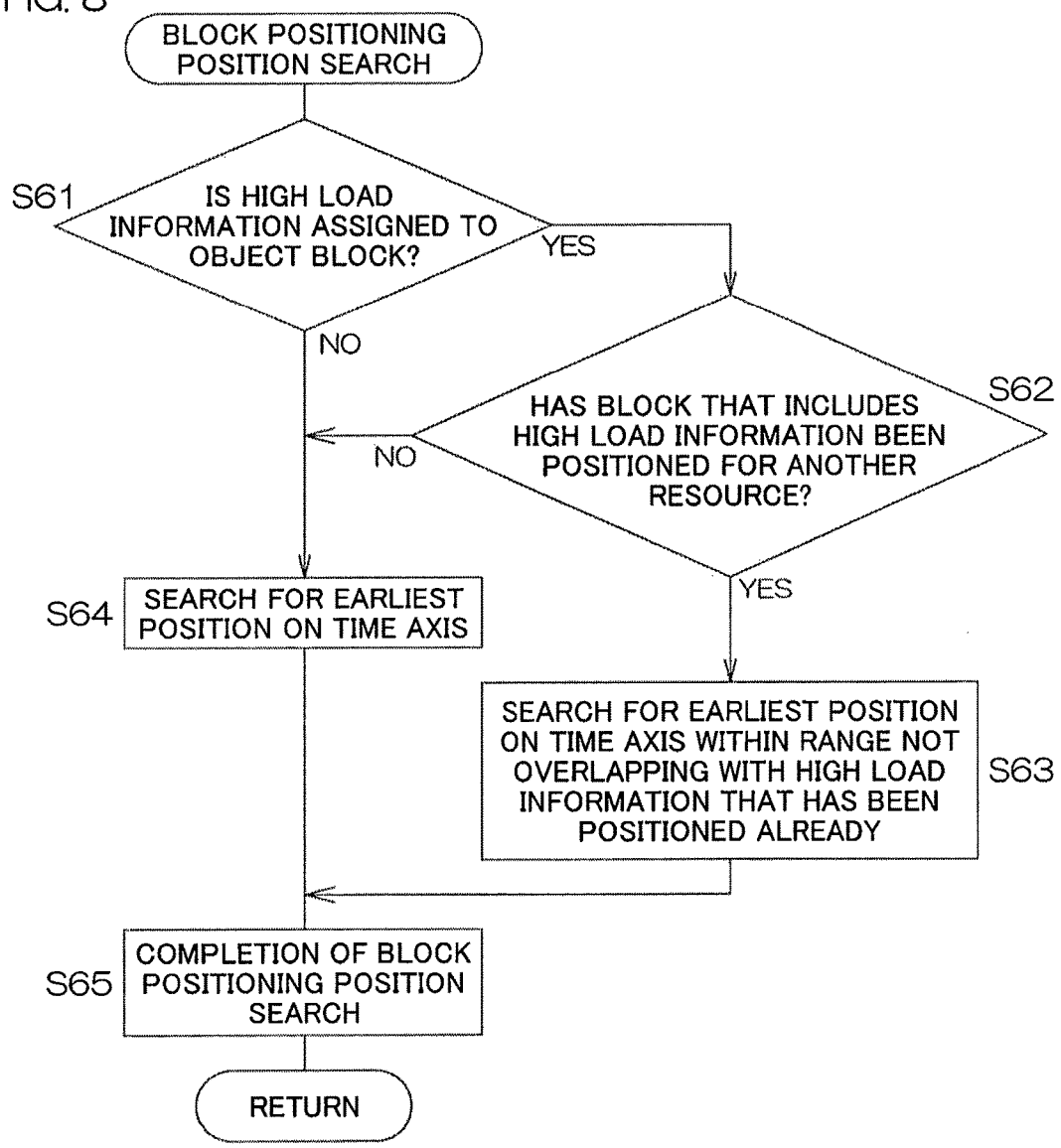
FIG. 8 is a flowchart of a flow of a block positioning position search processing.

FIGS. 4A to 4D and FIG. 5 are flowcharts for describing a processing example by the scheduling function portion 29. The processes of FIG. 4A to FIG. 4D and the processes of FIG. 5 are executed in parallel. Specifically, in the processes of FIG. 4A to FIG. 4D, substrate scheduling for respective substrates A1 to A12 belonging to a process job is performed. In parallel to this, a timing at which the scheduling for each of the substrates A1 to A12 ends is monitored in the processes of FIG. 5. FIG. 6 shows an example of a tentative timetable. FIG. 7 is a flowchart of a flow of a tentative timetable preparation processing. FIG. 8 is a flowchart of a flow of a block positioning position search processing. Each of FIG. 9 to FIG. 23 shows an example of schedule preparation.

A processing performed by the first controller 24 executing the schedule preparation program 39 is expressed in FIGS. 4A to 4D. In other words, a process group is incorporated in the schedule preparation program 39 to make the first controller 24 execute the processing shown in FIG. 4.

One feature of the schedule preparation method according to the present preferred embodiment is that blocks corresponding to "high load operations," to be described below, are positioned with respect to each other on a time axis so that high load time slots thereof are not concentrated. Another feature of the schedule preparation method according to the present preferred embodiment is that after completion of schedule preparation of a first substrate W, which, among a plurality of substrates W assigned a process job code in common, is dispensed first from a substrate container C, the prepared schedule is started at a timing at which schedule preparation of a substrate W other than the first substrate W is uncompleted.

An example of schedule preparation shall now be described mainly with reference to FIG. 1 to FIG. 5. FIG. 6 to FIG. 23 shall be referenced where appropriate.

In the following schedule example, an example of preparing a plan (schedule) for "N" (where N is an integer not less than "2" and not greater than "12") substrates W that are assigned the same process job code "A" shall be described. For the sake of convenience, a first substrate (first substrate) that is dispensed first shall be referred to as the "substrate A1" and a second substrate (second substrate) that is dispensed next is referred to as the "substrate A2" in the description.

Prior to schedule preparation, an allowable range of a "high load operation" to be described below (a condition with which it is determined that an operation is not a "high load operation") is stored in the first storage portion 26 (step S0). As an example of an allowable range of a "high load operation," that a usage rate of the CPU 37 during program execution is less than 90% on the average during any one second and that a state in which the usage rate of the CPU 37 during program execution is 100% does not last for 0.1 seconds can be cited.

When a substrate processing starting command is provided from the host computer HC or by an operator via the input/output portion 22 (step S1: YES), the scheduling function portion 29 prepares tentative timetables for all substrates W for which the substrate processing starting command is provided (step S2). The substrate processing starting command may be issued not in units of one substrate W but for all substrates W contained in a substrate container C as a unit. The substrate processing starting command may command a start of processing of substrates W assigned with a single process job code or a plurality of process job codes.

For example, suppose that a recipe associated with a certain process job code in the processing content data 38 designates parallel processing at the processing units SPIN1 to SPIN12. That is, a case where the substrate processing according to the recipe is executable at any of the twelve processing units SPIN1 to SPIN12 shall be considered. In this case, there are twelve alternative paths through which a substrate W that is assigned the process job code may pass when it is processed. That is, the paths that can be selected for the processing of the substrate W are the twelve paths each passing through one of the processing units SPIN1 to SPIN12. The scheduling function portion 29 thus prepares tentative timetables corresponding to the twelve paths.

FIG. 6 shows an example of a tentative timetable corresponding to the path that passes through the processing unit SPIN1. The tentative timetable includes a preliminary preparation block expressing the execution of the preliminary preparation process, a pre-carry-in processing block expressing the execution of a pre-carry-in processing step, a substrate processing block expressing a processing performed by the processing unit SPIN1 on the substrate W, a post-carry-out processing block expressing the execution of a post-carry-out processing process, a first carry-out block expressing the dispensing (carry-out) of the substrate W from the substrate container C by the indexer robot IR, a first carry-in block expressing the carry-in of the substrate W into a receiving/passing unit PASS by the indexer robot IR, a second carry-out block expressing the carry-out of the substrate W from the receiving/passing unit PASS by the main transfer robot CR, a second carry-in block expressing the carry-in of the substrate W into the processing unit SPIN1 by the main transfer robot CR, a third carry-out block expressing the carry-out of the processed substrate W from the processing unit SPIN1 by the main transfer robot CR, a third carry-in block expressing the carry-in of the substrate W into the receiving/passing unit PASS by the main transfer robot CR, a fourth carry-out block expressing the carry-out of the substrate W from the receiving/passing unit PASS by the indexer robot IR, and a fourth carry-in block expressing the carry-in of the substrate W into the substrate container C by the indexer robot IR. Although in FIG. 6 and FIG. 13 to FIG. 24, each first carry-in block and/or fourth carry-out block is illustrated to correspond to an operation of the receiving/passing unit PASS for the sake of illustration, each of these blocks actually corresponds to an operation of the indexer robot IR. Also, although each second carry-in block and/or third carry-out block is illustrated to correspond to processing by any of the respective processing units SPIN1 to SPIN12 for the sake of illustration, each of these blocks actually corresponds to an operation of the main transfer robot CR. Although the tentative timetable shown in FIG. 6 includes the preliminary preparation block, it does not include a post processing block that is a block expressing the execution of a post processing process.

In the description that follows, each of the first to fourth carry-out blocks and the first to fourth carry-in blocks may be referred to generically as a "transfer block." Also, each of the blocks among the blocks shown in FIG. 6 besides the preliminary preparation block may be referred to generically as a "processing/transfer block."

The pre-carry-in processing step refers to operations performed by a processing unit for carry-in of a substrate W into the processing unit. An operation of opening the shutter 17c, an operation of displacing the chuck pins 15b to open orientations (orientations of not clamping the substrate W), etc., can be cited as examples of the pre-carry-in processing step.

The post-carry-out processing process refers to operations performed by a processing unit after carry-out of a substrate from the processing unit. An operation of closing the shutter 17c, an operation of displacing the chuck pins 15b to closed orientations (orientations of clamping the substrate W), etc., can be cited as examples of the post-carry-out processing process.

As shown in FIG. 7, in the preparation of the tentative timetable, the scheduling function portion 29 acquires recipes for all substrates W that were given the substrate processing starting command (step S51 of FIG. 7), generates blocks to be included in the tentative timetable based on the recipes (step S52 of FIG. 7), and prepares the tentative timetable.

The scheduling function portion 29 checks whether or not any high load time slots that are time slots in which a control load occurring in the second controller 34 is high are present (are included) in operations corresponding to the generated blocks (step S53 of FIG. 7). In the present preferred embodiment, a high load time slot is, for example, a time slot in which at least one of either of the usage rate of the CPU 37 during program execution being not less than 90% on the average during any one second and the state in which the usage rate of the CPU 37 during program execution is 100% lasting for 0.1 seconds is satisfied. In the description that follows, an operation of a resource that includes a high load time slot shall be referred to as a "high load operation."

Of the respective operations of the substrate processing apparatus 1 that are defined in the tentative timetable of FIG. 6, the preliminary preparation process, the substrate processing step, and the pre-carry-in processing step correspond to "high load operations."

At a starting time of each preliminary preparation process, the serial communication portion 36 of the sub-controller 23 reads the recipe necessary for the substrate processing based on the scheduling result 32 from the second storage portion 35. The CPU 37 performs data interpretation of the read recipe and generates a control signal for realizing the recipe at a corresponding processing unit among the processing units SPIN1 to SPIN12. The CPU 37 sends the generated control signal to the control object processing unit among the processing units SPIN1 to SPIN12 via the serial communication portion 36. Also, immediately upon receiving the control signal, the control object processing unit among the processing units SPIN1 to SPIN12 sends a reception confirmation signal toward the serial communication portion 36. A data amount of processing data of the preliminary preparation process is large and therefore a high control load arises temporarily when the serial communication portion 36 and the CPU 37 perform the data communication and the data interpretation. That is, a high load time slot is present at the starting time of the preliminary preparation process.

Also, at a starting time of each substrate processing step, the serial communication portion 36 of the second controller 34 sends the recipe to the control object processing unit among the processing units SPIN1 to SPIN12. Also, immediately upon receiving the recipe, the control object processing unit among the processing units SPIN1 to SPIN12 sends a reception confirmation signal toward the serial communication portion 36. A data amount of the recipe is enormous and therefore a high control load arises temporarily in the serial communication portion 36 and the CPU 37. That is, a high load time slot is present at the starting time of the substrate processing step.

At a starting time of each pre-carry-in processing step, the serial communication portion 36 of the second controller 34 sends processing data related to the pre-carry-in processing step, and also sends the recipe together with the data to the control object processing unit among the processing units SPIN1 to SPIN12. A data amount of the recipe is enormous and therefore a high control load arises temporarily in the serial communication portion 36 and the CPU 37. That is, a high load time slot is present at the start of the pre-carry-in processing step.

If a generated block corresponds to a "high load operation" (step S53 of FIG. 7: YES), the scheduling function portion 29 assigns, as shown in FIG. 6, a high load information HL to an initial time slot of the block (that is, a time slot corresponding to the starting time of the pre-carry-in processing step at which a high control load arises) (step S54 of FIG. 7). The scheduling function portion 29 thereby completes the preparation of the tentative timetable (step S55 of FIG. 7). That is, in a block corresponding to a high load operation, the high load information HL is assigned to a portion corresponding to a high load time slot. On the other hand, if a generated block does not correspond to a "high load operation" (step S53 of FIG. 7: NO), the scheduling function portion 29 completes the preparation of the tentative timetable as it is (step S55 of FIG. 7).

The scheduling function portion 29 prepares the tentative timetable by successively positioning all blocks to be included in the tentative timetable so as not to overlap with each other on the time axis. For a substrate W, the scheduling function portion 29 prepares similar tentative timetables corresponding to the paths respectively passing through the processing units SPIN2 to SPIN12 (tentative timetables with blocks positioned at the processing units SPIN2 to SPIN12, respectively). Tentative timetables for a total of twelve paths are thus prepared for a single substrate W.

Similar tentative timetables are prepared in correspondence to all substrates W that are assigned a process job code in common. The thus prepared tentative timetables are stored in the first storage portion 26 as a portion of the scheduling data 33.

When, as shown in FIG. 4A, a scheduling command is generated (step S3: YES), positioning of blocks related to the substrates W that are assigned the process job code in common is performed (steps S4 to S32). Specifically, the scheduling function portion 29 reads the tentative timetables of the substrates W from the first storage portion 26 and positions the blocks, constituting the tentative timetable, on the time axis.

To describe more specifically, the scheduling function portion 29 references the contents of the preliminary preparation execution condition and judges whether or not to perform the preliminary preparation process (step S4). If the process job requires the preliminary preparation process (that is, if the preliminary preparation execution condition corresponding to the substrates W is "required"; step S4: YES), a preliminary preparation process schedule is prepared (steps S5 and S6) and if the preliminary preparation process is not required (that is, if the preliminary preparation execution condition corresponding to the substrates W is "not required"), the processing in each of S5 and S6 is skipped.

If the preliminary preparation process is required (step S4: YES), the scheduling function portion 29 positions the preliminary preparation block for each of the processing units among the processing units SPIN1 to SPIN12 for which there is a possibility of processing the corresponding substrate W (all of the processing units in the above-described example) (S5 and S6). That is, the preliminary preparation process schedules are prepared in a batch prior to the preparation of the schedules of the individual substrates W to be described below.

In a preliminary preparation block positioning position search (S5), the scheduling function portion 29 checks whether or not the high load information HL is assigned to a search object preliminary preparation block (whether or not the search object preliminary preparation block corresponds to a "high load operation") as shown in FIG. 8 (step S61 of FIG. 8). Also, if the high load information HL is assigned to the search object preliminary preparation block (step S61 of FIG. 8: YES), the scheduling function portion 29 then checks whether or not a block that includes the high load information HL (a block corresponding to a "high load operation") is already positioned for another resource (processing unit, etc.) (step S62 of FIG. 8). If the high load information HL is not assigned to the search object preliminary preparation block (step S61 of FIG. 8: NO) or a block that includes the high load information HL is not positioned for another resource (step S62 of FIG. 8: NO), the scheduling function portion 29 determines the earliest position on the time axis as the positioning position of the search object preliminary preparation block (step S64 of FIG. 8) and thereby completes the preliminary preparation block positioning position search (step S65 of FIG. 8).

On the other hand, if the high load information HL is assigned to the preliminary preparation block for which the positioning position is searched (step S61 of FIG. 8: YES) and a block that includes the high load information HL (a block corresponding to a "high load operation") is positioned for another resource (step S62 of FIG. 8: YES), the scheduling function portion 29 determines, as the positioning position of the search object preliminary preparation block, the earliest position on the time axis within a time slot in which the high load information HL of a block that has been positioned already is not allocated (step S63 of FIG. 8) and thereby completes the preliminary preparation block positioning position search (step S65 of FIG. 8).

Figure 9:
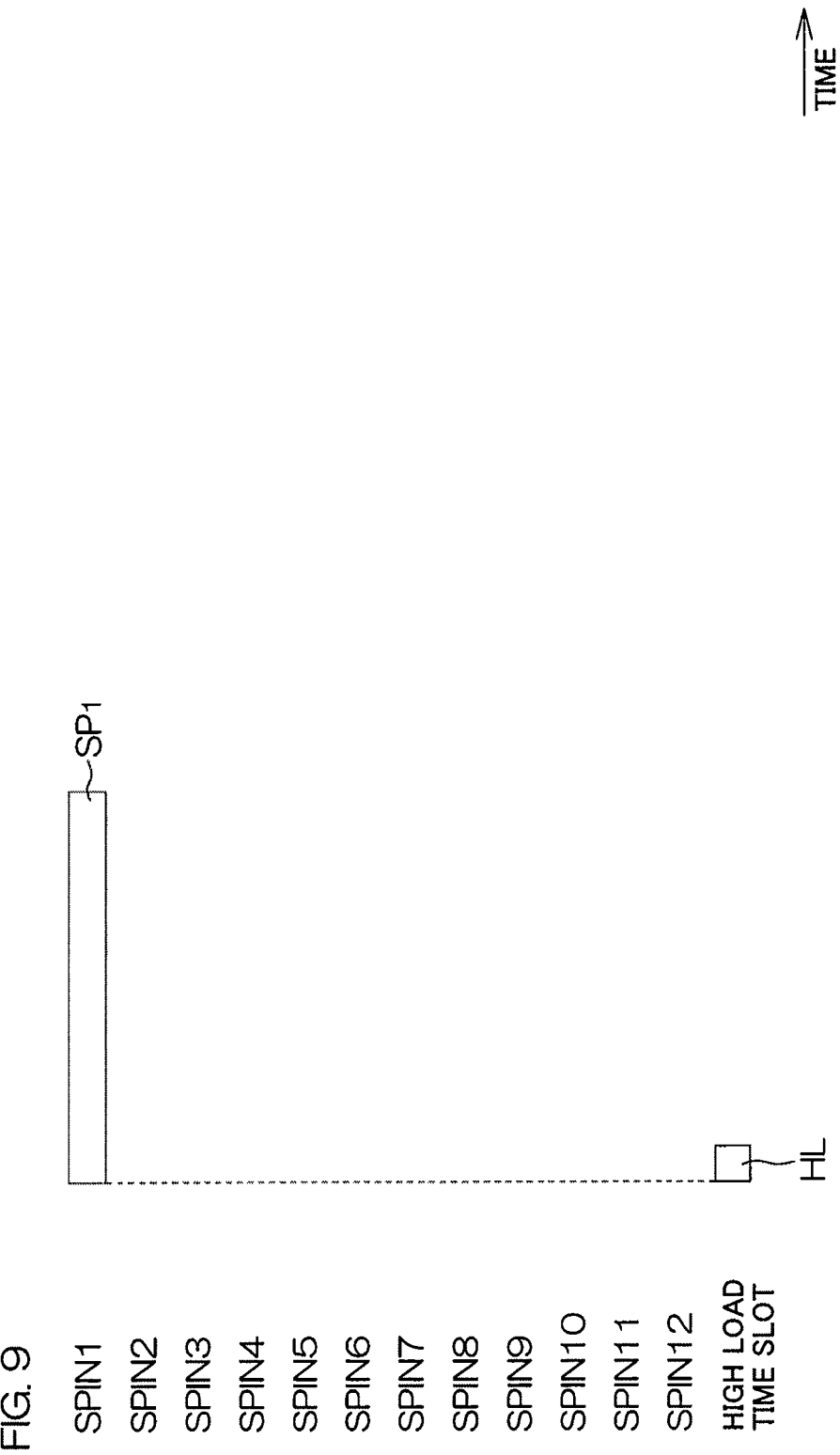
FIG. 9 shows an example of schedule preparation.

First, the scheduling function portion 29 positions a preliminary preparation block $SP_1$ for the processing unit SPIN1. In this process, the scheduling function portion 29 reads the tentative timetable for the first substrate A1 from the first storage portion 26 and, as shown in FIG. 9, positions the preliminary preparation block $SP_1$ included in the tentative timetable at the earliest position on the time axis, that is, at the current time point. The high load information HL is assigned to the thus positioned preliminary preparation block $SP_1$.

Figure 10:
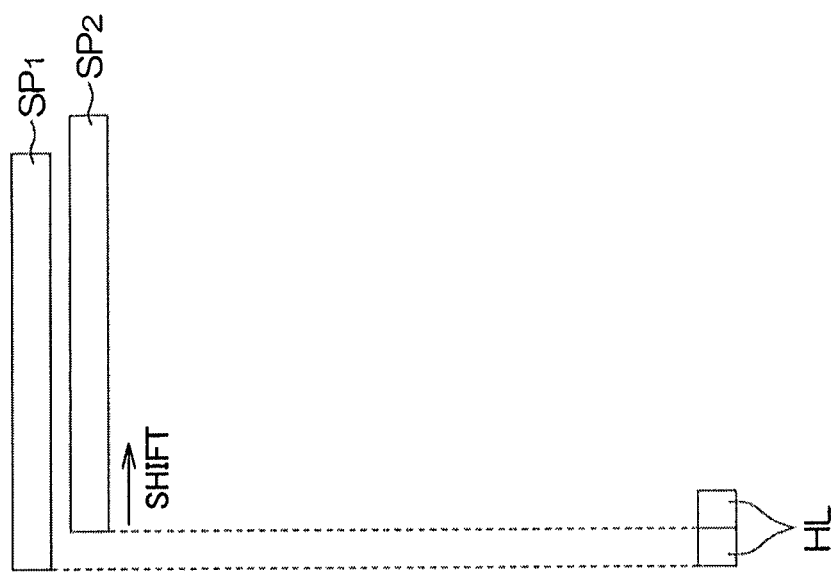
FIG. 10 shows an example of schedule preparation.

Next, the scheduling function portion 29 positions a preliminary preparation block $SP_2$ for the processing unit SPIN2. The high load information HL is assigned to the thus positioned preliminary preparation block $SP_2$. In this process, the scheduling function portion 29 reads the tentative timetable for the second substrate A2 from the first storage portion 26 and, as shown in FIG. 10, positions the preliminary preparation block $SP_2$ included in the tentative timetable at the earliest position on the time axis so that the high load information HL assigned to the preliminary preparation block $SP_2$ is positioned within a time slot in which the high load information HL included in the preliminary preparation block $SP_1$ for the processing unit SPIN1 is not allocated. That is, the scheduling function portion 29 shiftingly positions the preliminary preparation block $SP_2$ for the processing unit SPIN2 at a position on the time axis after the earliest position on the time axis so that the high load information HL included in the preliminary preparation block $SP_2$ is not allocated in the same time slot as the preliminary preparation block $SP_1$ for the processing unit SPIN1 (high load avoidance positioning step).

Figure 11:
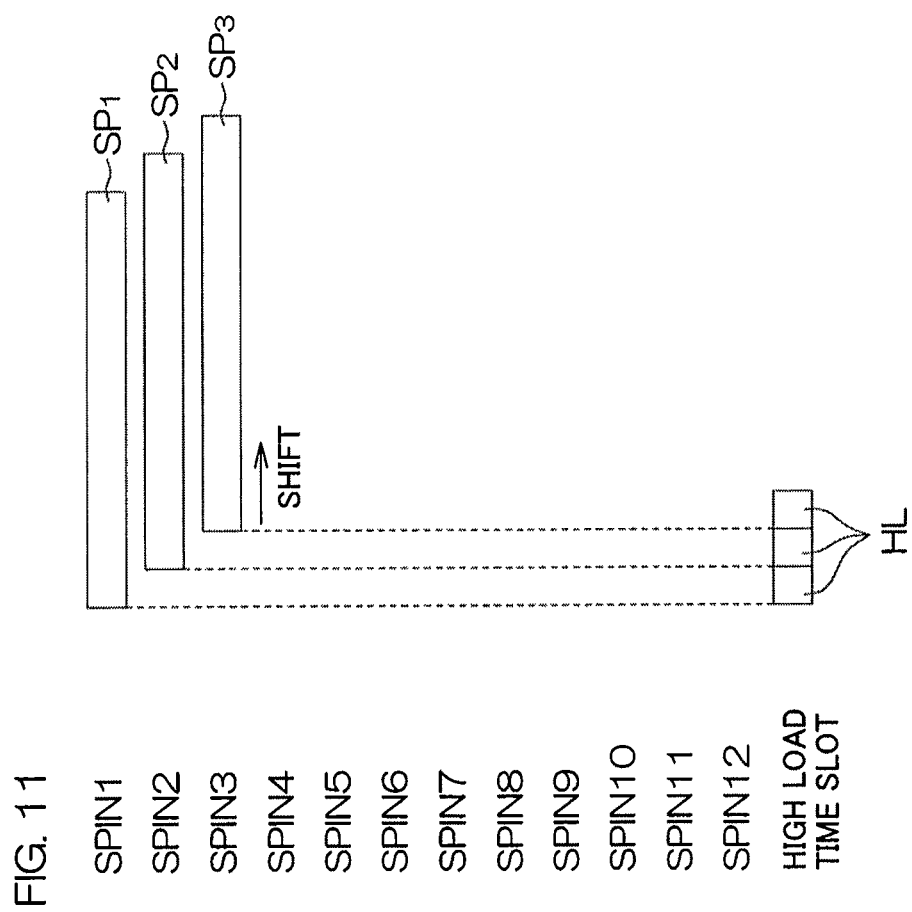
FIG. 11 shows an example of schedule preparation.

Next, the scheduling function portion 29 positions the preliminary preparation block $SP_3$ for the processing unit SPIN3. The high load information HL is assigned to the thus positioned preliminary preparation block $SP_3$. In this process, the scheduling function portion 29 reads the tentative timetable for a third substrate W from the first storage portion 26 and, as shown in FIG. 11, positions the preliminary preparation block $SP_3$ included in the tentative timetable at the earliest position on the time axis so that the high load information HL assigned to the preliminary preparation block $SP_3$ is positioned within a time slot in which the high load information HL included in each of the preliminary preparation block $SP_1$ and the preliminary preparation block $SP_2$ for the processing units SPIN1 and SPIN2 is not allocated. That is, the scheduling function portion 29 shiftingly positions the preliminary preparation block $SP_3$ for the processing unit SPIN3 at a position on the time axis after the earliest position on the time axis so that the high load information HL included in the preliminary preparation block $SP_3$ is not allocated in the same time slot as the high load information HL included in each of the preliminary preparation blocks $SP_1$ and $SP_2$ for the processing units SPIN1 and SPIN2 (high load avoidance positioning step).

The scheduling function portion 29 thus positions each of the preliminary preparation blocks, included in the read tentative timetables, at the earliest position on the time axis (that is, so as to fill in from the front) so that the same resource is not used overlappingly at the same time and while avoiding the high load information HL from being allocated to the same time slot as the high load information HL of a block that has been positioned already.

Figure 12:
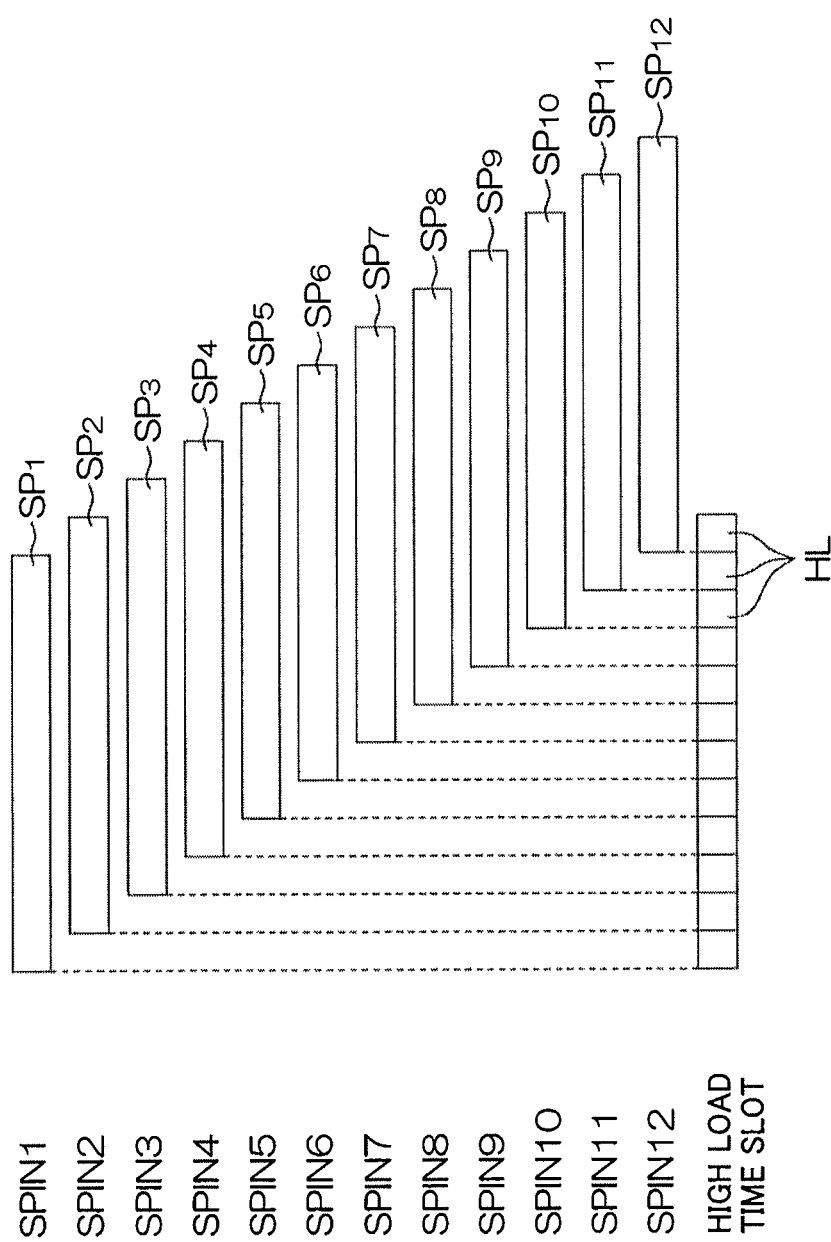
FIG. 12 shows an example of schedule preparation.

When the positioning of the preliminary preparation blocks $SP_1$ to $SP_{12}$ corresponding to all of the processing units SPIN1 to SPIN12 is completed (this state is shown in FIG. 12; step S7: YES), the scheduling function portion 29 then positions the processing/transfer blocks for the respective substrates W (step S8 to step S12).

First, the scheduling function portion 29 reads the tentative timetable corresponding to the first substrate A1 from the first storage portion 26, references the tentative timetable corresponding to the first substrate A1, and acquires a single processing/transfer block included in the tentative timetable (step S8). The processing/transfer block acquired at this point is the processing/transfer block, among the yet-to-be-positioned processing/transfer blocks, that is positioned at the earliest position on the time axis of the tentative timetable. Further, the scheduling function portion searches for a position at which the acquired processing/transfer block is to be positioned (step S9) and positions the processing/transfer block in accordance with the search result (step S10).

In the processing/transfer block positioning position search (S9), the scheduling function portion 29 checks whether or not the high load information HL is assigned to the search object processing/transfer block (whether or not the search object processing/transfer block corresponds to a "high load operation") as shown in FIG. 8 (step S61 of FIG. 8). Also, if the high load information HL is assigned to the search object processing/transfer block (step S61 of FIG. 8: YES), the scheduling function portion 29 then checks whether or not a block that includes the high load information (a block corresponding to a "high load operation") is already positioned for another resource (processing unit, etc.) (step S62 of FIG. 8). If the high load information HL is not assigned to the search object processing/transfer block (step S61 of FIG. 8: NO) or a block that includes the high load information HL is not positioned for another resource (step S62 of FIG. 8: NO), the scheduling function portion 29 determines the earliest position on the time axis as the positioning position of the search object processing/transfer block (step S64 of FIG. 8) and thereby completes the processing/transfer block positioning position search (step S65 of FIG. 8).

On the other hand, if the high load information HL is assigned to the processing/transfer block for which the positioning position is searched (step S61 of FIG. 8: YES) and a block that includes the high load information HL (a block corresponding to a "high load operation") is positioned for another resource (step S62 of FIG. 8: YES), the scheduling function portion 29 determines, as the positioning position of the search object processing/transfer block, the earliest position on the time axis within a time slot in which the high load information HL of a block that has been positioned already is not allocated (step S63 of FIG. 8) and thereby completes the processing/transfer block positioning position search (step S65 of FIG. 8).

Figure 13:
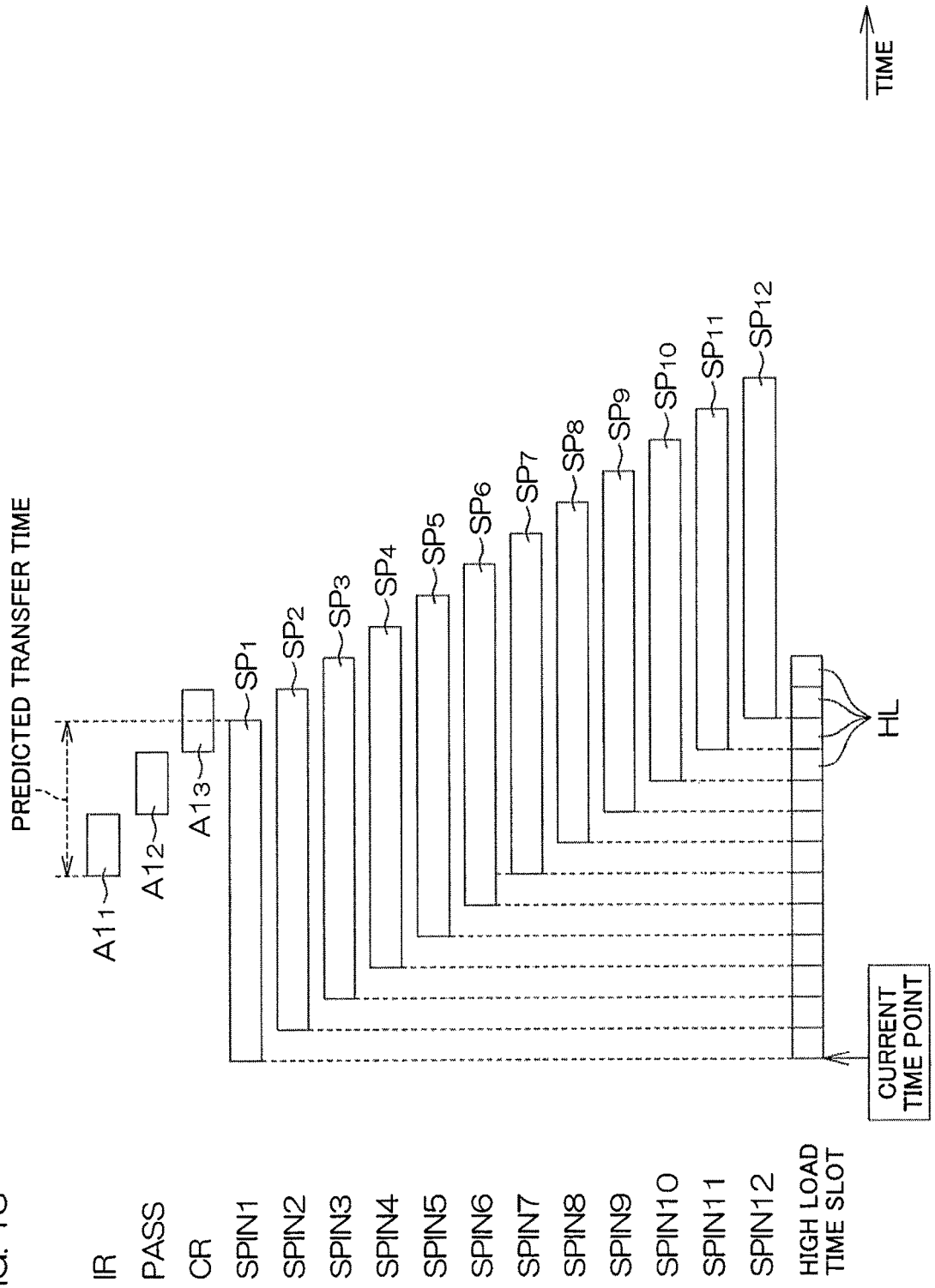
FIG. 13 shows an example of schedule preparation.

Specifically, the scheduling function portion 29 first positions a first carry-out block $A1_1$, a first carry-in block $A1_2$, and a second carry-out block $A1_3$ for the first substrate A1 on the time axis successively as shown in FIG. 13. The scheduling function portion 29 positions the first carry-out block $A1_1$ for the first substrate A1 not at the earliest position on the time axis (that is, the current time point) but at a reasonable position upon back-calculating a scheduled transfer time from a processing enabled time point at the processing unit SPIN1 (that is, a point in time of the end of the preliminary preparation process at the processing unit SPIN1). The first carry-in block $A1_2$ and the second carry-out block $A1_3$ are respectively positioned in chronological order in accordance with the positioning position of the first carry-out block $A1_1$.

Figure 14:
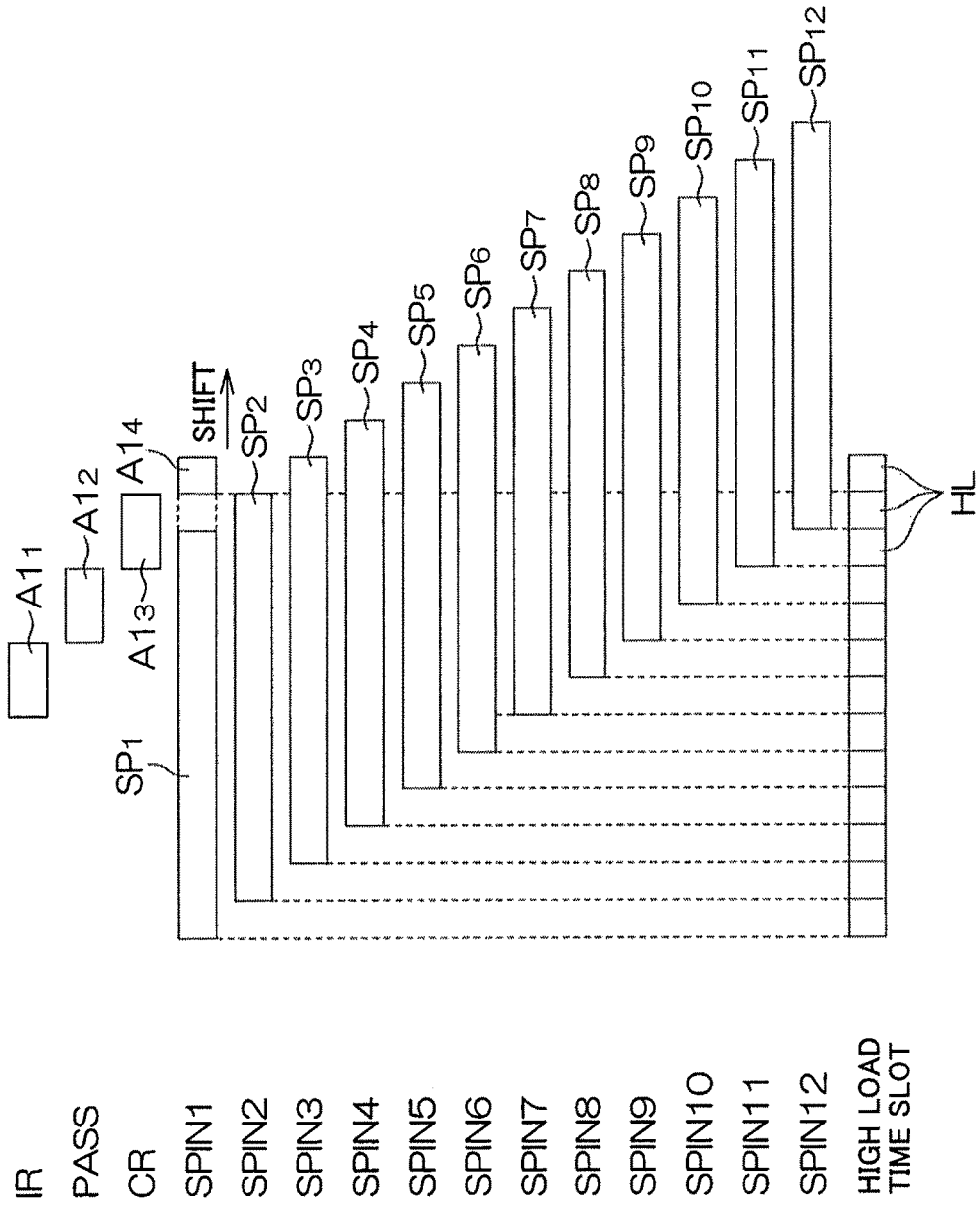
FIG. 14 shows an example of schedule preparation.

Next, the scheduling function portion 29 performs positioning of a pre-carry-in processing block $A1_4$ for the first substrate A1 as shown in FIG. 14. Although if just positioning at the earliest position on the time axis while avoiding overlapping use of the same resource at the same time is considered, the pre-carry-in processing block $A1_4$ for the first substrate A1 should be positioned at the position indicated by broken lines in FIG. 14, if such positioning is performed, the high load information HL assigned to the pre-carry-in processing block $A1_4$ overlaps with the high load information HL included in the preliminary preparation block ($SP1_2$ shown in FIG. 14) for the processing unit SPIN 12, and therefore the pre-carry-in processing block $A1_4$ is shiftingly positioned further rearward on the time axis than the position indicated by the broken lines in FIG. 14. In this case, the pre-carry-in processing block $A1_4$ is preferably positioned so as to fill in from the front as much as possible.

Figure 15:
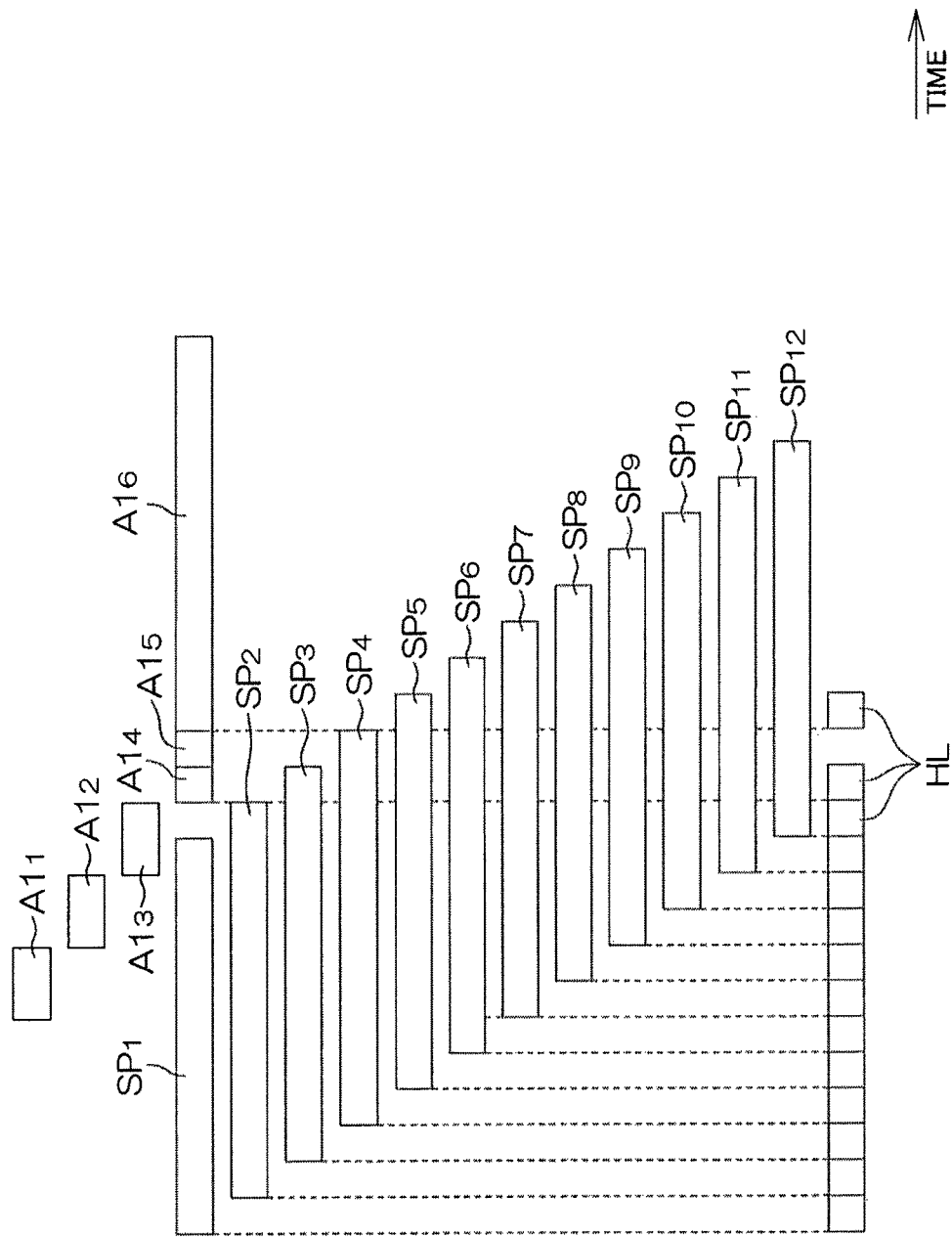
FIG. 15 shows an example of schedule preparation.

Next, the scheduling function portion 29 positions a second substrate carry-in block $A1_5$ and a substrate processing block $A1_6$ for the first substrate A1 on the time axis as shown in FIG. 15. Next, as shown in FIG. 16, the scheduling function portion 29 positions a third carry-out block $A1_7$ and a third carry-in block $A1_8$ for the first substrate A1 on the time axis and thereafter positions a post-carry-out processing block $A1_9$, a fourth carry-out block $A1_{10}$ and a fourth carry-in block $A1_{11}$ on the time axis.

Figure 16:
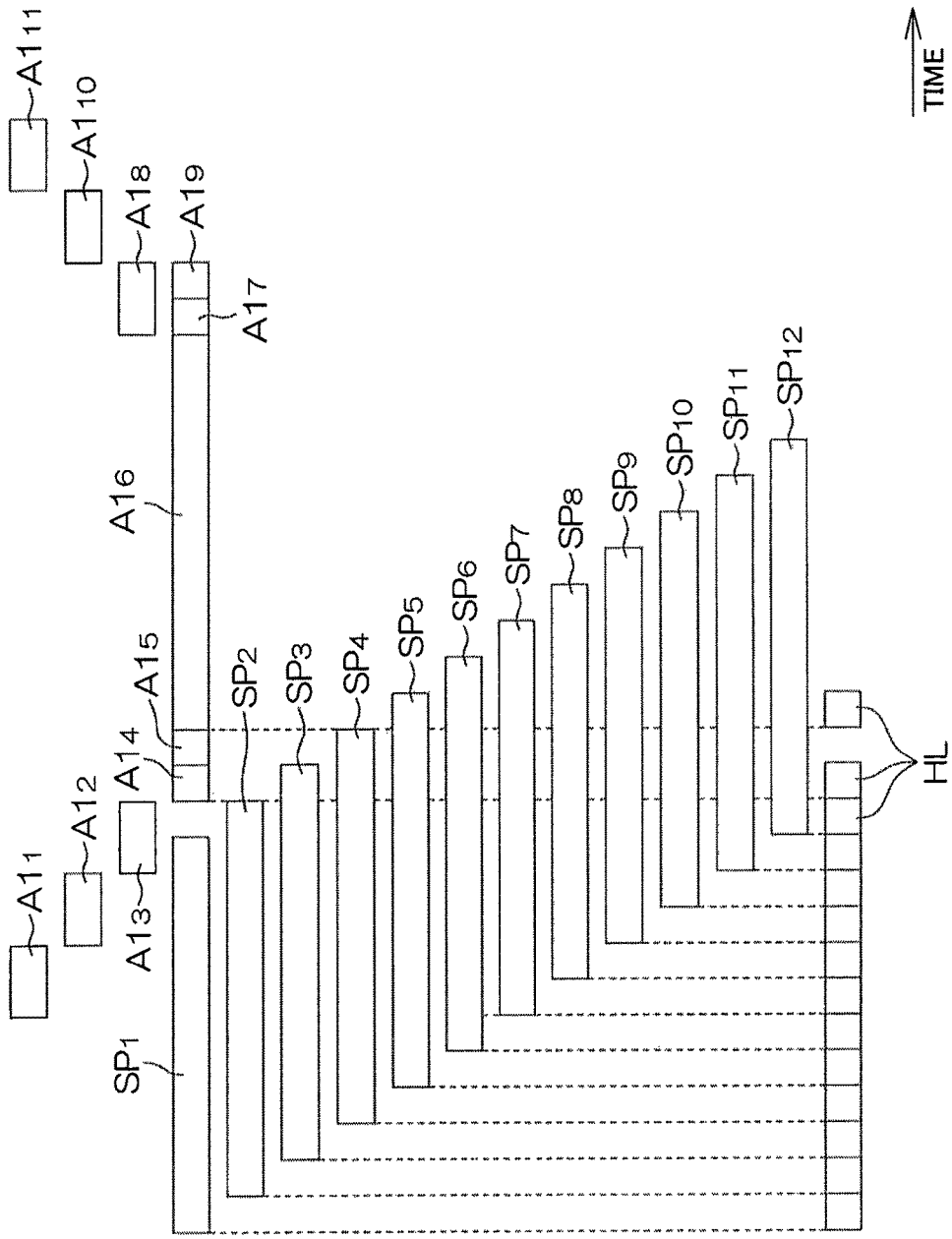
FIG. 16 shows an example of schedule preparation.

When, as shown in FIG. 16, the positioning of all blocks constituting the tentative timetable for the first substrate A1 is ended (step S11: YES), the preparation of the schedule for the first substrate A1 is ended (step S12) and the prepared schedules including the preliminary preparation blocks $SP_1$ to $SP_{12}$ for the processing units SPIN1 to SPIN12 and the processing/transfer blocks $A1_1$ to $A1_{11}$ for the first substrate A1 are stored as a portion of the schedule data 33 in the first storage portion 26 (step S13). When the preparation of the schedule for the first substrate A1 ends, the block at step S41 of the flowchart of FIG. 5, which was executed in parallel to the scheduling processing of FIGS. 4A to 4D, becomes YES (step S41: YES). Thereafter, the scheduling function portion 29 makes the process of FIG. 5 enter step S42 from S41 and starts execution of the prepared schedules (step S42). That is, the scheduling function portion 29 makes operations of the resources start in accordance with the prepared schedules. Specifically, the preliminary preparation process is started at each of the processing units SPIN1 to SPIN12. Also, the first substrate A1 is dispensed (carried out) from the substrate container C by the indexer robot IR.

Returning to the flowchart of FIG. 4B, when the schedule data 33 for the first substrate A1 are stored in the first storage portion 26 (step S13), it is judged whether or not it is presently a timing for starting scheduling for the second substrate A2 (step S14). In the present preferred embodiment, a timing at which an immediately prior substrate $A_N$ (Nth substrate, "N" is an integer not less than "2") is dispensed from the substrate container C is set as a timing for starting scheduling for an immediately subsequent substrate $A_{N+1}$.

Figure 17:
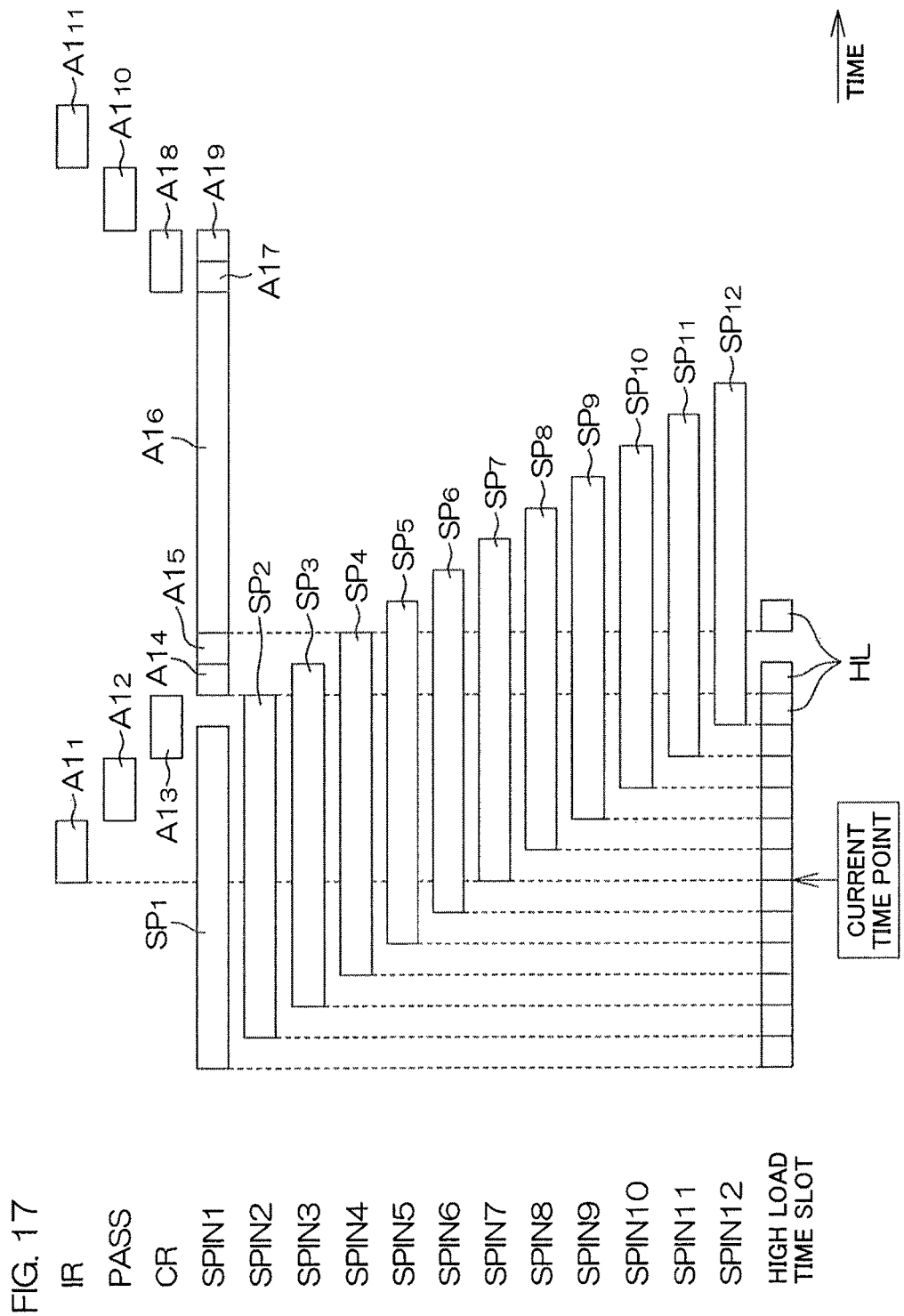
FIG. 17 shows an example of schedule preparation.
Figure 18:
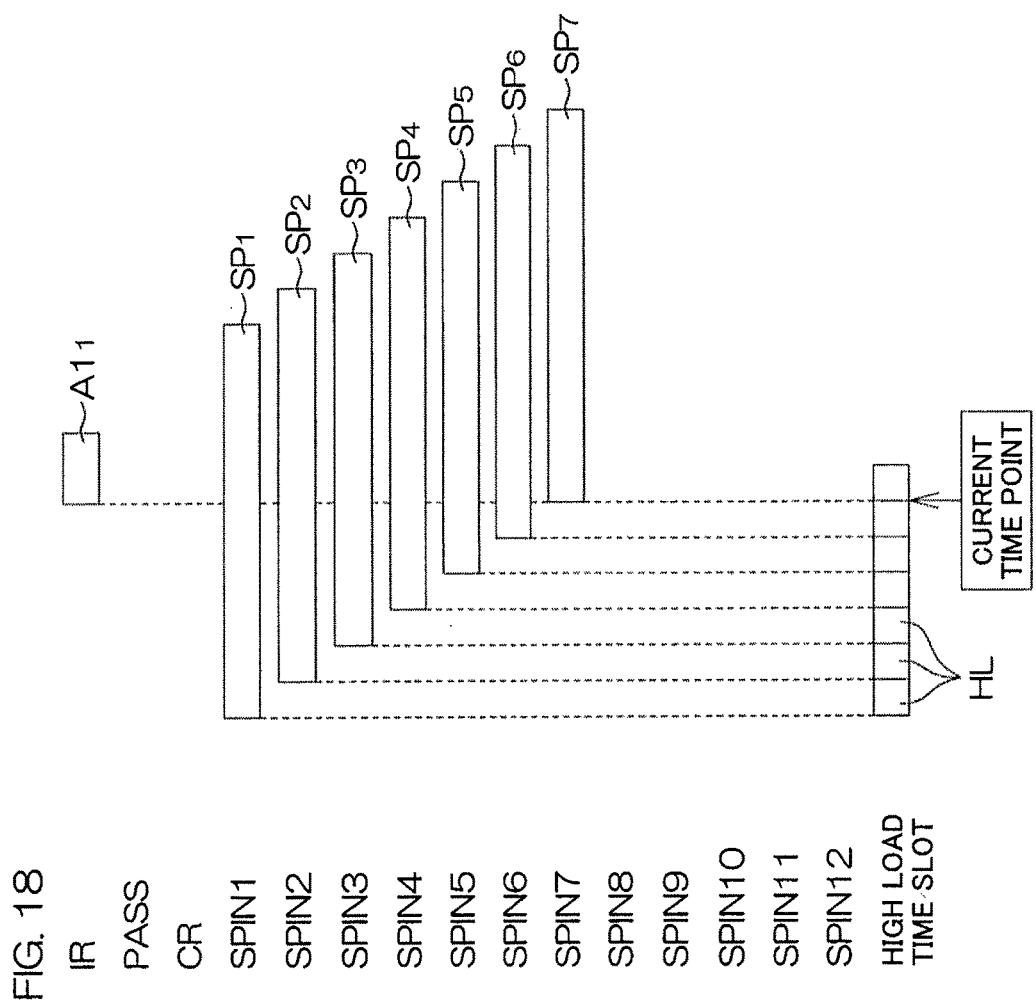
FIG. 18 shows an example of schedule preparation.

Therefore, when the first substrate A1 is dispensed from the substrate container C, it is judged that the timing for starting scheduling for the second substrate A2 has arrived (step S14: YES). That is, when the first substrate A1 is dispensed from the substrate container C, the preparation of the schedule for the second substrate A2 (that is, the positioning of processing/transfer blocks $A2_1$ to $A2_{11}$ described below) is performed in parallel to the substrate processing of the first substrate A1. If changing of a prepared schedule is allowed (step S15: YES), the scheduling function portion 29 deletes, from the time axis, future blocks among all blocks constituting the schedule for the first substrate A1 (step S16) as shown in FIG. 17 and FIG. 18. In the deletion of the future blocks, just the blocks corresponding to operations of resources that have been started already and the blocks scheduled to be started immediately after the current time point are left and all the other blocks are deleted.

In the present schedule example, the resources that are already started at the current time point in FIG. 17 are the processing units SPIN1 to SPIN6 and the blocks corresponding to these resources are the preliminary preparation blocks $SP_1$ to $SP_6$. Also, the resources that are scheduled to be started immediately after the current time point are the indexer robot IR and the processing unit SPIN7 and the blocks corresponding to these resources are the first transfer block $A1_1$ and the preliminary preparation block $SP_7$. Therefore, as shown in FIG. 17 and FIG. 18, the scheduling function portion 29 deletes, from among the processing/transfer blocks $A1_1$ to $A1_{11}$ and the preliminary preparation blocks $SP_1$ to $SP_{12}$ scheduled at the current time point in FIG. 17, the blocks other than the first transfer block $A1_1$ and the preliminary preparation blocks $SP_1$ to $SP_7$, that is, the processing transfer blocks $A1_2$ to $A1_{11}$ and the preliminary preparation blocks $SP_6$ to $SP_{12}$.

Not just blocks corresponding to operations of resources that have been started already but also blocks corresponding to operations of resources scheduled to be started immediately after the current time point are left because there is a possibility that an operation of a resource scheduled to be started immediately after the current time point is already started.

Figure 19:
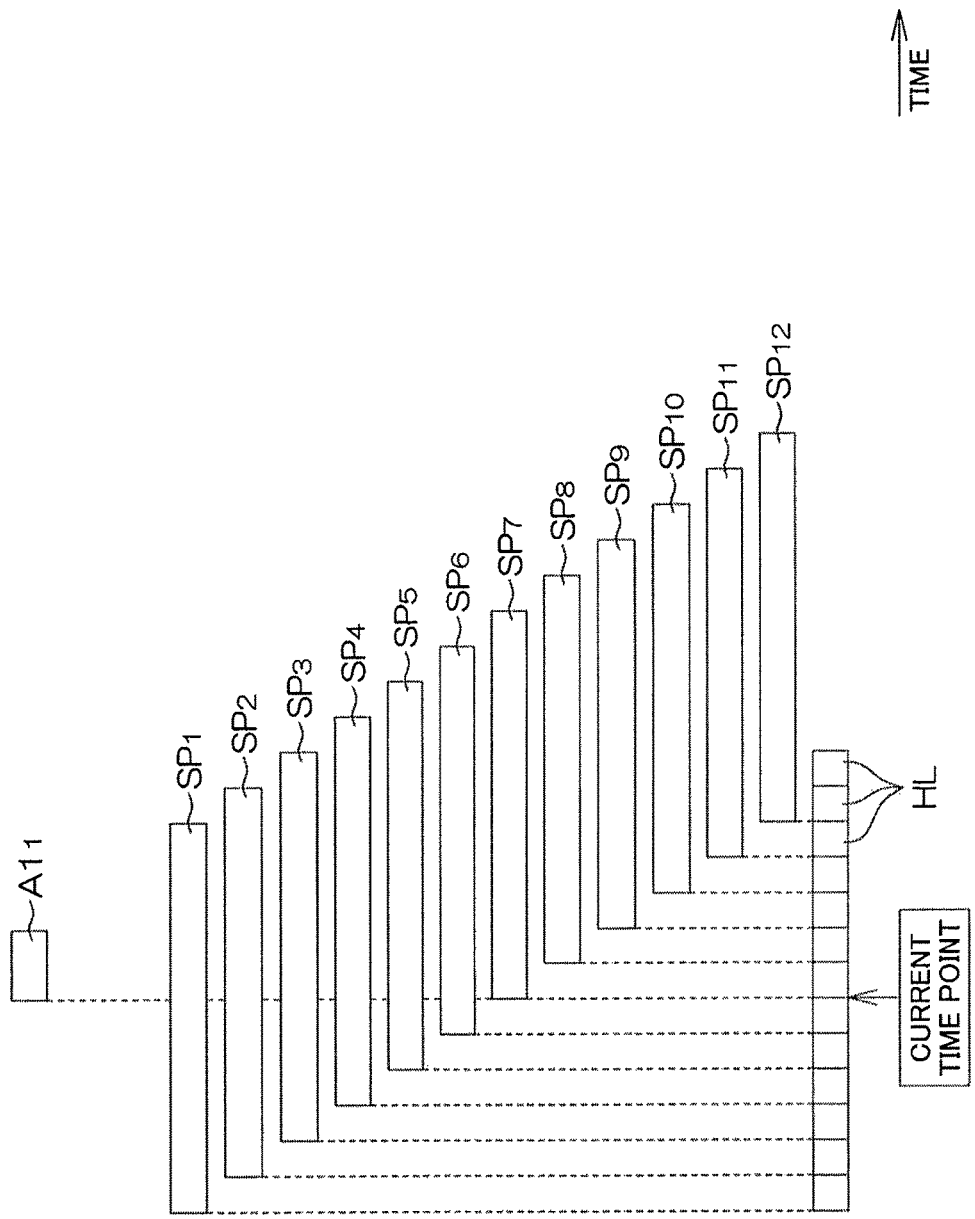
FIG. 19 shows an example of schedule preparation.

Next, as shown in FIG. 19, the scheduling function portion 29 repositions the preliminary preparation blocks $SP_8$ to $SP_{12}$, which were deleted in step S16, on the time axis (step S17). A search for positions at which the preliminary preparation blocks $SP_8$ to $SP_{12}$ are to be repositioned is performed by the same method as the search for the positioning positions of the preliminary preparation blocks of step S6, and the preliminary preparation blocks $SP_8$ to $SP_{12}$ for the processing units SPIN8 to SPIN12 are repositioned in accordance with the search result.

Next, the scheduling function portion 29 repositions the processing/transfer blocks $A1_2$ to $A1_{11}$, which were deleted in step S16, on the time axis and positions the processing/ transfer blocks $A2_1$ to $A2_{11}$ for the second substrate A2 on the time axis. The repositioning of the deleted processing/transfer blocks $A1_2$ to $A1_{11}$ is performed in parallel to the positioning of the processing/transfer blocks for the second substrate A2.

The scheduling function portion 29 acquires one of the deleted processing/transfer blocks $A1_2$ to $A1_{11}$ (step S18). The processing/transfer block that is acquired at this time is the processing/transfer block that is positioned at the earliest position on the time axis before deletion.

Also, the scheduling function portion 29 reads the tentative timetable corresponding to the second substrate A2 from the first storage portion 26, references the tentative timetable corresponding to the second substrate A2 and acquires a single processing/transfer block included in the tentative timetable (step S18). The processing/transfer block acquired at this point is the processing/transfer block, among the yet-to-be-positioned processing/transfer blocks, that is positioned at the earliest position on the time axis of the tentative timetable.

Next, the scheduling function portion 29 searches for positions at which the acquired processing/transfer blocks (the deleted processing/transfer block and the processing/transfer block for the second substrate) are to be positioned (step S19) and positions the processing/transfer blocks in accordance with the search results (step S20). The search for the repositioning position of the deleted processing/transfer block and the positioning position search for the processing/transfer block for the second substrate A2 are performed in parallel to each other. In step S19, each of the searches for the positions at which the processing/transfer blocks are to be positioned is performed by the same method as the processing/transfer block positioning position search of step S9. That is, the scheduling function portion 29 searches for the earliest position on the time axis so that with the processing/transfer block that is the object for which the positioning position is searched (the deleted processing/transfer block or the processing/transfer block for the second substrate A2), the same resource is not used overlappingly at the same time and allocation of the high load information HL to the same time slot as the high load information HL of a block that has been positioned already is avoided (steps S61 to S65 of FIG. 8).

Figure 20:
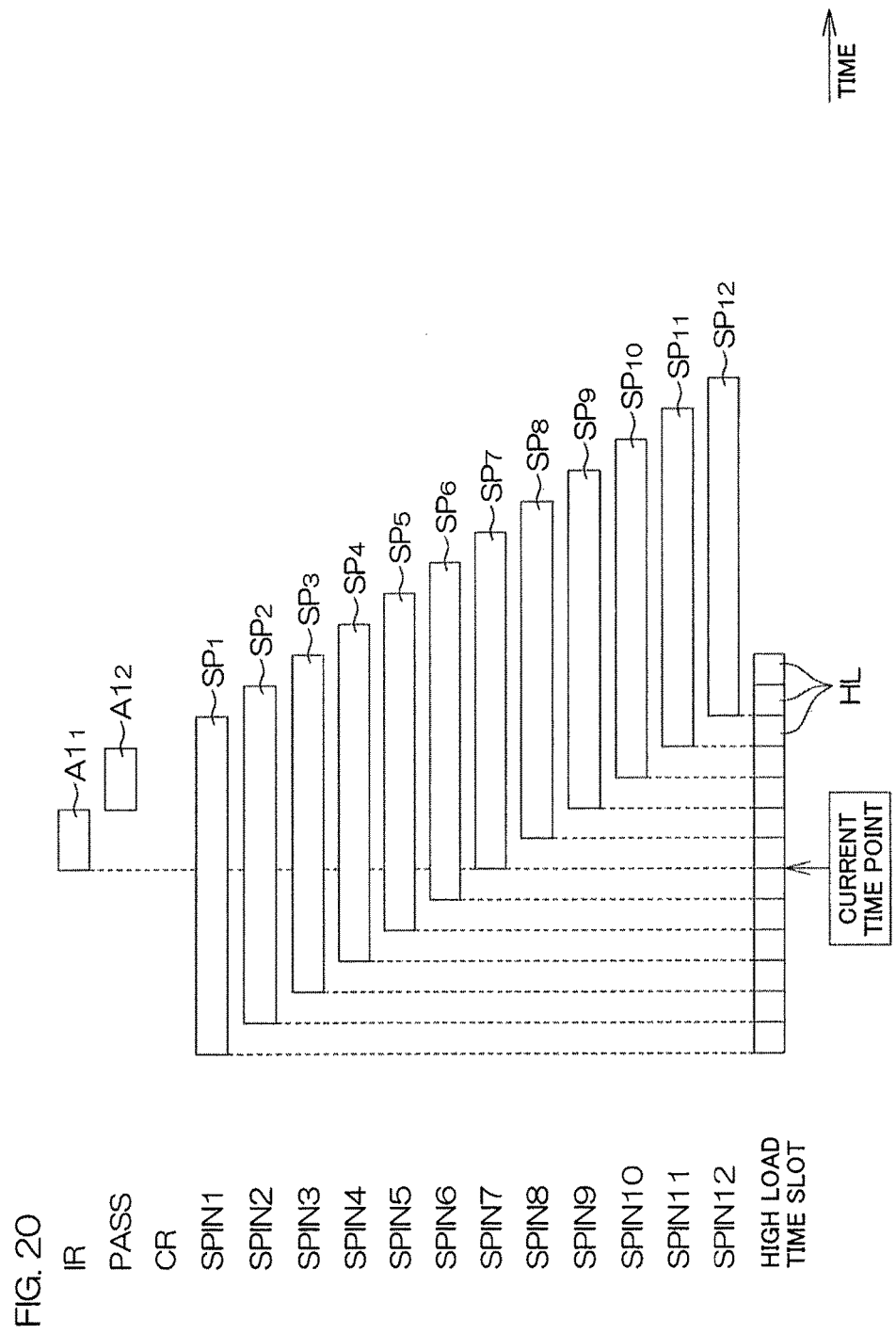
FIG. 20 shows an example of schedule preparation.
Figure 21:
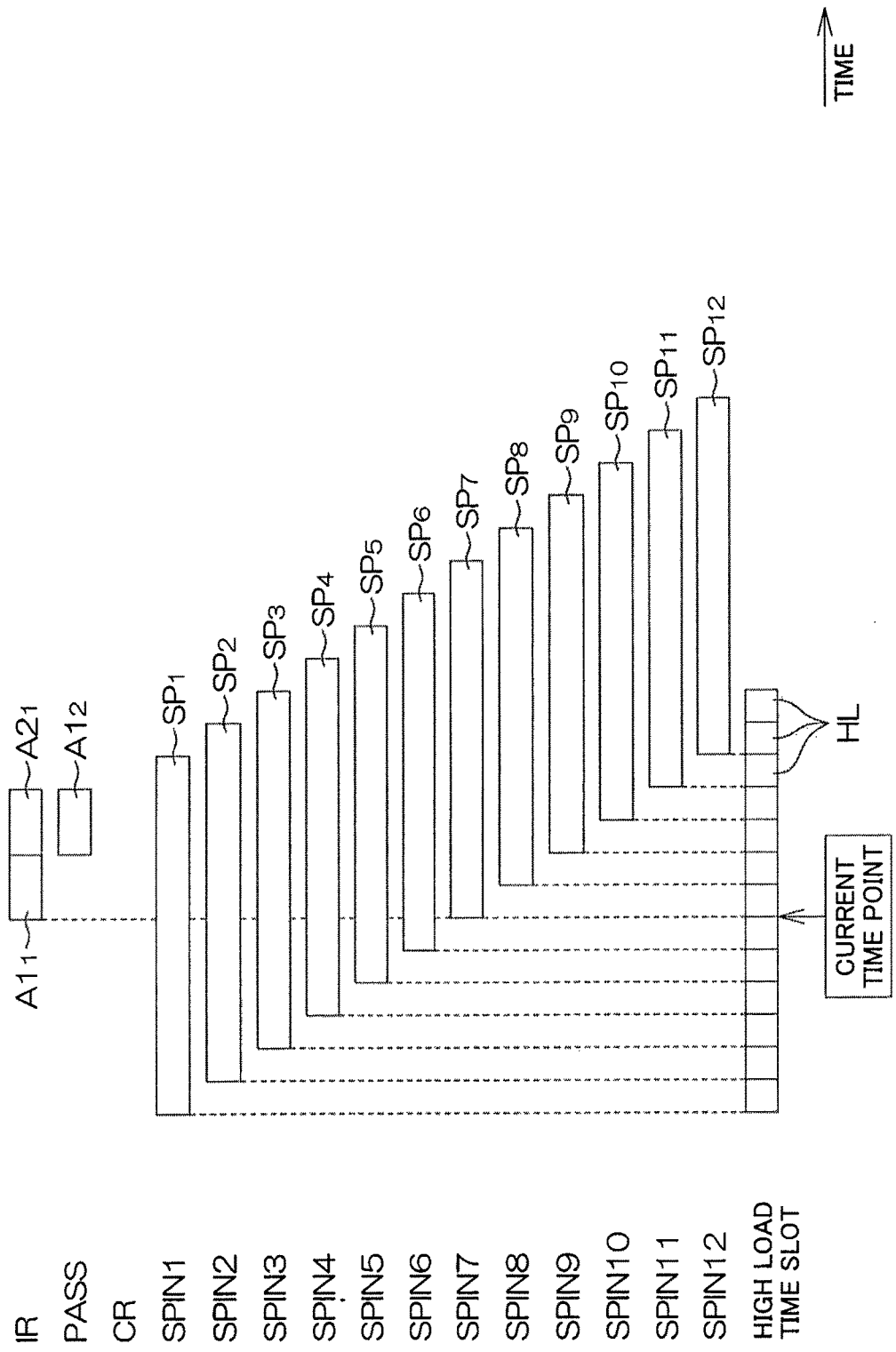
FIG. 21 shows an example of schedule preparation.

An example of the positioning position search (S19) and the positioning (S20) of each of the deleted processing/transfer block and the processing/transfer block for the second substrate A2 shall now be described successively. Specifically, the scheduling function portion 29 repositions the first carry-in block $A1_2$, which was deleted in step S16, at the original position as shown in FIG. 20. Also, the scheduling function portion 29 positions the first carry-out block $A2_1$ for the second substrate A2 after the first carry-out block $A1_1$ for the first substrate A1 as shown in FIG. 21. In the example of FIG. 21, the first carry-out block $A2_1$ for the second substrate A2 is positioned at substantially the same position on the time axis as the first carry-in block $A1_2$.

Figure 22:
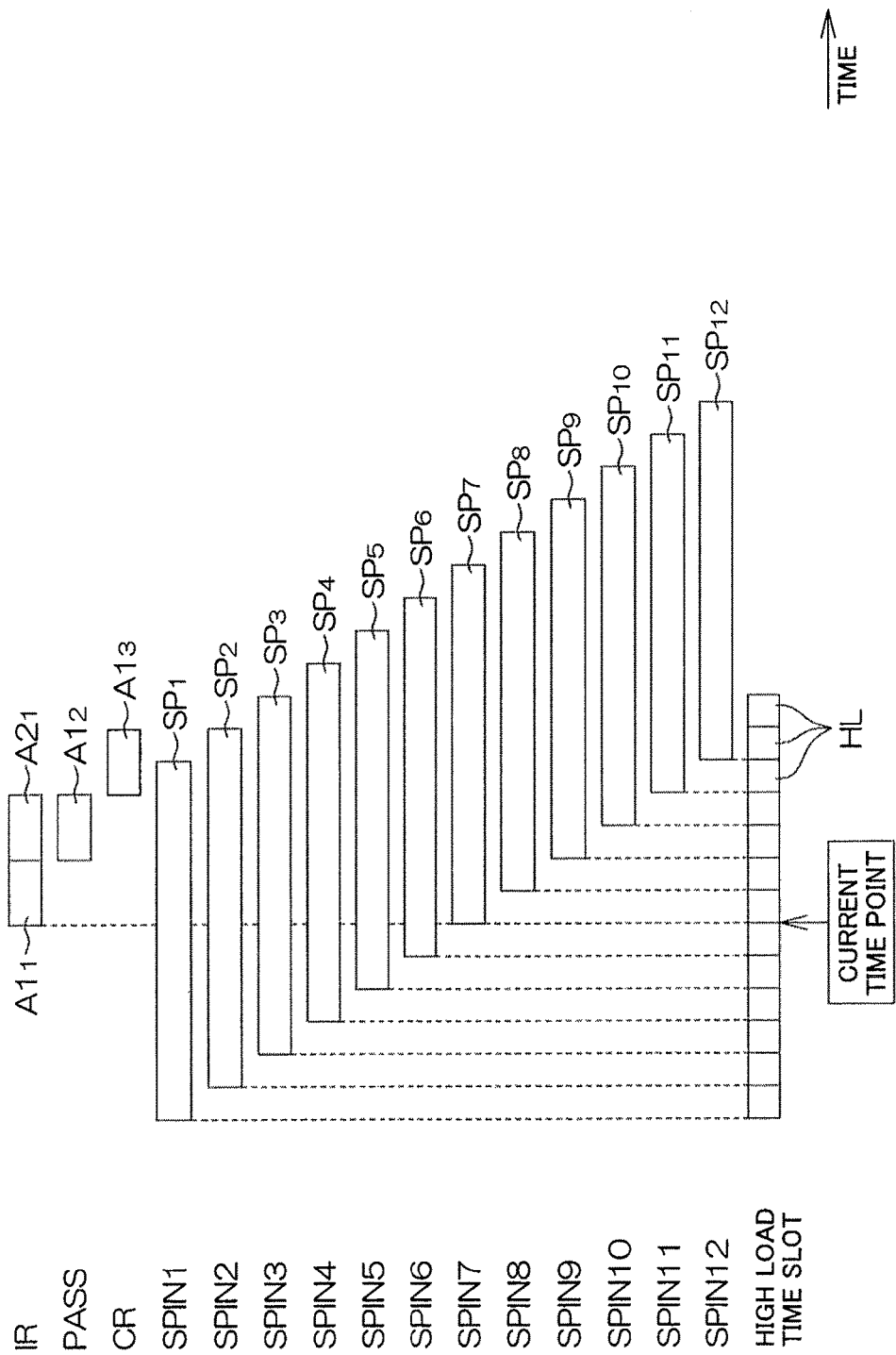
FIG. 22 shows an example of schedule preparation.

Next, the scheduling function portion 29 positions the deleted second carry-out block $A1_a$ as shown in FIG. 22. The repositioning of each deleted processing/transfer block and the positioning of each processing/transfer block for the second substrate are thus performed in unison (in parallel).

Figure 23:
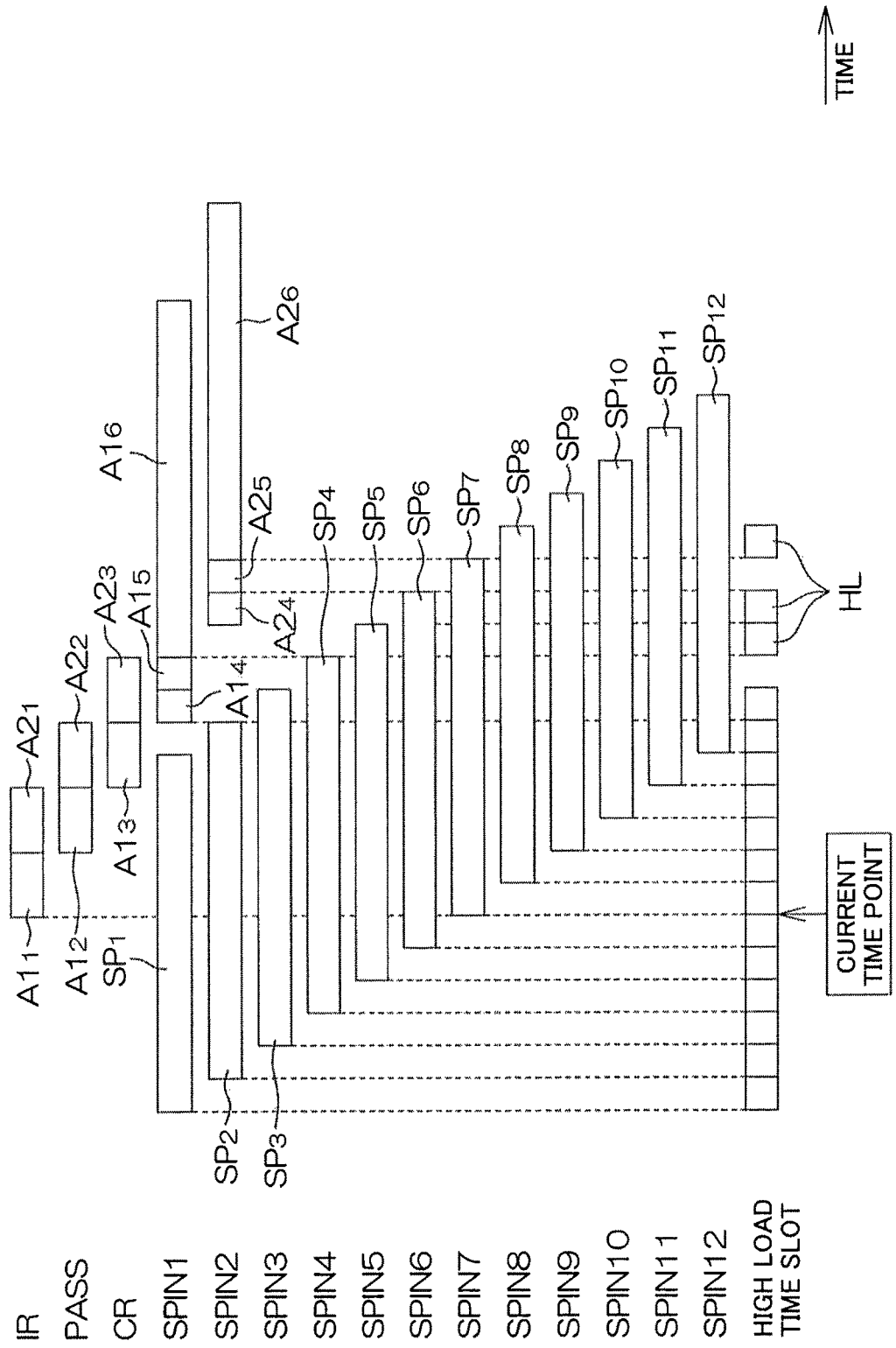
FIG. 23 shows an example of schedule preparation.

When the positioning of all deleted processing/transfer blocks and all blocks constituting the tentative timetable for the second substrate A2 is ended (step S21: YES), the scheduling for the second substrate A2 is ended and the changing of the schedule (the prepared schedule) for the first substrate A1 is ended as shown in FIG. 23 (step S22). The schedules that have been prepared and changed thus are stored as a portion of the schedule data 33 in the first storage portion 26 (step S23).

On the other hand, if changing of a prepared schedule is prohibited (step S15: NO), the scheduling function portion 29 positions the processing/transfer blocks for the second substrate A2 without changing the schedule for the first substrate A1.

The scheduling function portion 29 then reads the tentative timetable corresponding to the second substrate A2 from the first storage portion 26, references the tentative timetable corresponding to the second substrate A2, and acquires a single processing/transfer block included in the tentative timetable (step S24). The processing/transfer block acquired at this point is the processing/transfer block, among the yet-to-be-positioned processing/transfer blocks, that is positioned at the earliest position on the time axis of the tentative timetable. Further, the scheduling function portion 29 searches for the earliest position on the time axis so that with the acquired processing/transfer block, the same resource is not used overlappingly at the same time and allocation of the high load information HL to the same time slot as the high load information HL of a block that has been positioned already is avoided (step S25) and positions the processing/transfer block in accordance with the search result (step S26).

When the positioning of all blocks constituting the tentative timetable for the second substrate A2 is ended (step S27: YES), the preparation of the schedule for the second substrate A2 is ended (step S22). The schedule for the second substrate A2 that has been thus prepared is stored as a portion of the schedule data 33 in the first storage portion 26 (step S23).

When at the substrate processing apparatus 1, operations of the respective resources progress and a timing for executing the schedule for the second substrate A2 arrives, the scheduling function portion 29 starts the execution of the schedule for the second substrate A2. That is, the scheduling function portion 29 makes operations of the resources start in accordance with the prepared schedule for the second substrate A2. Specifically, the second substrate A2 is dispensed (carried out) from the substrate container C by the indexer robot IR. The time of dispensing of the second substrate A2 from the substrate container C is a timing for scheduling for a third substrate A3. When the timing for scheduling for the third substrate A3 arrives (step S14: YES), that is, when the second substrate A2 is dispensed from the substrate container C, preparation of the schedule for the third substrate A3 is performed.

The scheduling for each of the third and subsequent substrates W is performed in the same manner as the schedule for the second substrate A2. That is, the processing in each of steps S14 to S27 of FIGS. 4B and 4C is applied in common to each of the third and subsequent substrates W. That is, if changing of a prepared schedule is allowed, then when a schedule for an N-th substrate W is being prepared, future blocks in the respective schedules for each of the (N−1)th and prior substrates W are deleted and repositioning of each of the deleted processing/transfer blocks is performed in parallel to positioning (schedule preparation) of each of the processing/transfer blocks for the Nth substrate. Processing equivalent to the processing in each of steps S14 to S27 of FIGS. 4B and 4C is repeated until "N" becomes 12 (that is, until preparation of schedules for all substrates W is ended; step S28: YES). An example of an entirety of schedules for a plurality of substrates W that are prepared by the scheduling function portion 29 is shown in FIG. 24.

When the preparation of schedules for all substrates W is ended (step S28: YES), the scheduling function portion 29 references the contents of the post-processing execution condition and judges whether or not to perform the post-processing process on the substrates W (step S29). If the process job requires the post-processing process (that is, if the post-processing execution condition corresponding to the substrates W is "required"; step S29: YES), the scheduling function portion 29 positions the post-processing block for each of the processing units among the processing units SPIN1 to SPIN12 for which there is a possibility of processing the corresponding substrate W (steps S30 and S31). On the other hand, if the post-processing process is not required (that is, if the post-processing execution condition corresponding to the substrates W is "not required"), the processing in each of steps S30 to S32 is skipped.

In a post-processing block positioning position search (S30), the scheduling function portion 29 checks whether or not the high load information HL is assigned to a search object post-processing block (whether or not the search object post-processing block corresponds to a "high load operation") as shown in FIG. 8 (step S61 of FIG. 8). Also, if the high load information HL is assigned to the search object post-processing block (step S61 of FIG. 8: YES), the scheduling function portion 29 then checks whether or not a block that includes the high load information (a block corresponding to a "high load operation") is already positioned for another resource (processing unit, etc.) (step S62 of FIG. 8). If the high load information HL is not assigned to the search object post-processing block (step S61 of FIG. 8: NO) or a block that includes the high load information HL is not positioned for another resource (step S62 of FIG. 8: NO), the scheduling function portion 29 determines the earliest position on the time axis as the positioning position of the search object post-processing block (step S64 of FIG. 8) and thereby completes the post-processing block positioning position search (step S65 of FIG. 8).

On the other hand, if the high load information HL is assigned to the post-processing block for which the positioning position is searched (step S61 of FIG. 8: YES) and a block that includes the high load information HL (a block corresponding to a "high load operation") is positioned for another resource (step S62 of FIG. 8: YES), the scheduling function portion 29 determines, as the positioning position of the search object post-processing block, the earliest position on the time axis within a time slot in which the high load information HL of a block that has been positioned already is not allocated (step S63 of FIG. 8) and thereby completes the post-processing block positioning position search (step S65 of FIG. 8).

The scheduling function portion 29 thus positions each post-processing block successively at the earliest position on the time axis (that is, so as to fill in from the front) so that the high load information HL assigned to the post-processing block is positioned within a time slot in which the high load information HL of a block that has been positioned already is not allocated (step S31).

When the positioning of the post-processing blocks corresponding to the processing units among the processing units SPIN1 to SPIN12 that require post-processing is completed (YES in step S32), a return is performed for the series of processing shown in FIGS. 4A to 4D.

On the other hand, if the post-processing process is not required (that is, if the post-processing execution condition corresponding to the substrates W is "not required," NO in step S29), the processing in each of steps S30 to S32 is skipped and thereafter a return is performed for the series of processing shown in FIGS. 4A to 4D.

The schedules shown in FIG. 24 illustrate a case where the post-processing execution condition is met for each substrate W.

By the above, according to the present preferred embodiment, the scheduling function portion 29 positions a plurality of blocks for each substrate W in chronological order to prepare the schedule for the substrate W and prepares the schedules for a plurality of the substrates W. In this process, blocks corresponding to "high load operations" (that is, the substrate processing step, the preliminary preparation process, and the pre-carry-in processing step) are positioned at positions on the time axis that are shifted with respect to each other so that starting times of the corresponding "high load operations" are not concentrated.

With the thus prepared schedules, concentrating of control load at the second controller 34 is avoided. Schedules with which efficiency of data processing at the second controller 34 is improved can thus be prepared and delay of start of operation of a resource can thus be prevented reliably.

If the preliminary preparation processes at the processing units SPIN1 to SPIN2 are planned based just on a logic of "positioning at the earliest position on the time axis so that the same resource is not used overlappingly at the same time," a plurality of the preliminary preparation processes may start at the same time. Especially, when, as in a first modification example of schedule preparation shown in FIG. 25A, during schedule preparation for substrates W that are assigned some process job code, execution of substrate processing is already started for substrates W that are assigned a different process job code, the preliminary preparation processes for the substrates W of the predetermined process job (processing units SPIN3 to SPIN12) are planned based just on the logic of "positioning each block at the earliest position on the time axis so that the same resource is not used overlappingly at the same time," these plurality of (for example, ten) preliminary preparation blocks may be positioned so as to be aligned at a planned startable time point (time point at which the schedules can be started). In this case, the preliminary preparation processes at the processing units SPIN3 to SPIN12 are planned to be started at the same time, so that, as a result of the control load of the second controller 34 concentrating at the starting time of the preliminary preparation processes, the second controller 34 cannot perform data processing smoothly and this may give rise to a problem, such as processing delay occurring in substrate processing being executed (processing at the processing units SPIN1 and SPIN2), etc.

On the other hand, with the present preferred embodiment, each of the preliminary preparation blocks is positioned at the earliest position on the time axis so that the same resource is not used overlappingly at the same time and while avoiding the high load information HL from being allocated to the same time slot as the high load information HL of a block that has been positioned already. Therefore, as shown in FIG. 25A, the preliminary preparation processes at the processing units SPIN3 to SPIN12 are planned so as to be shifted in starting time with respect to each other. A problem, such as processing delay, etc., can thus be avoided during execution of substrate processing (processing at the processing units SPIN1 and SPIN2).

Especially with the present preferred embodiment, a period from commanding of start of substrate processing to actual start of substrate processing can be made substantially the same among the respective substrates W and therefore an effect of substrate processing based on the same recipe can be made uniform among the respective substrates. This shall now be described more specifically. A data flow until a start of substrate processing is shown in FIG. 25B. Based on the schedule data 33 or based on a processing execution command issued by the processing execution commanding portion 31 based on the schedule data 33, the CPU 37 of the sub-controller 23 judges that a timing for starting substrate processing has arrived (time point t1). The CPU 37 requests the second storage portion 35 for a recipe corresponding to the substrate processing to be executed (time point t2). The second storage portion 35 selects and sends the recipe to the SPU 37 (time point t3 to time point t4). The CPU 37 performs data interpretation of the received recipe and generates the control signal for making a control object processing unit (for example, the processing unit SPIN1) execute the recipe (time points t5 to t6). The CPU 37 then sends the generated control signal to the processing unit SPIN1 (time points t7 to t8). Upon receiving the control signal, the processing unit SPIN1 actually starts the substrate processing (time point t9). Time of a predetermined length is thus required for the processing unit SPIN1 to actually start the substrate processing from the arrival of the timing for starting the substrate processing (time points t1 to t9). In the present preferred embodiment, scheduling is performed so that the substrate processing is not started at the same time for a plurality of substrates W and therefore a processing speed of the CPU 37 will not become delayed. The times required for the sending/receiving of the recipe (time points t3 to t4), data interpretation (time points t5 to t6), and sending/receiving of the control signal (time points t7 to t8) will thus not differ greatly among each substrate W. The time from the arrival of the timing for starting the substrate processing to the actual start of substrate processing at each processing unit SPIN can thus be made substantially the same. Uniformity of substrate processing can thus be secured.

Also, when the schedule preparation for a certain substrate (for example, the first substrate A1) ends, execution of the prepared schedules is started even if the schedule preparation has not ended for another substrate (for example, the substrates W from the second substrate A2 onward). Reduction of schedule data amount stored in the first storage portion 26 can thus be achieved.

Also, yet-to-be executed blocks deleted from prepared schedules are repositioned in chronological order in parallel to the positioning of blocks related to a substrate W for which a schedule is to be prepared anew. The repositioning of the deleted blocks and the positioning of the blocks related to the new substrate W are performed in chronological order so that mutual interference does not arise among the plurality of substrates W and so that the plurality of substrates W are processed by putting the resources (the processing units SPIN1 to SPIN12, etc.) in operation efficiently. The positioning positions of the deleted blocks and the blocks related to the new substrate W can be determined more finely to enable improvement of operation rates of the resources and productivity of the substrate processing apparatus 1 can thereby be improved.

FIG. 26 shows a second modification example of schedule preparation. In the second modification example, an example of positioning of post-processing blocks, each of which is a block for specifying the post-processing process, is illustrated.

In FIG. 26, the post-processing processes are planned during substrate processing at the processing units SPIN1 to SPIN7. In the present process job, the processing units SPIN1 to SPIN7 are used and although the processing units SPIN8 to SPIN12 are usable, these are actually not used. That is, a number of processing units that are actually used is less than a number of usable processing units. As mentioned above, the scheduling function portion 29 prepares the post-processing process schedules at a timing at which the preparation of the schedule for the last substrate W of the process job has ended.

If in this case, the post-processing processes at the processing units SPIN1 to SPIN12 are planned based just on the logic of "positioning at the earliest position on the time axis so that the same resource is not used overlappingly at the same time," the post-processing blocks for the processing units SPIN8 to SPIN12 may be positioned so as to be aligned at a planned startable time point (time point at which the schedules can be started). In this case, the post-processing processes at the processing units SPIN8 to SPIN12 are started at the same time so that, as a result of the control load of the second controller 34 concentrating at the starting time of the post-processing processes, the second controller 34 cannot perform data processing smoothly and this may give rise to a problem, such as processing delay occurring in substrate processing being executed (processing at the processing units SPIN1 to SPIN7), etc.

On the other hand, with the example of FIG. 26, each of the post-processing blocks is positioned at the earliest position on the time axis so that the same resource is not used overlappingly at the same time and while avoiding the high load information HL from being allocated to the same time slot as the high load information HL of a block that has been positioned already. Therefore, as shown in FIG. 26, the post-processing blocks for the processing units SPIN8 to SPIN12 are shiftingly positioned on the time axis with respect to each other. That is, the respective post-processing processes at the processing units SPIN8 to SPIN12 are planned so as to be shifted in starting time with respect to each other. A problem, such as processing delay, etc., can thus be avoided during execution of substrate processing (processing at the processing units SPIN1 to SPIN7).

Figure 27:
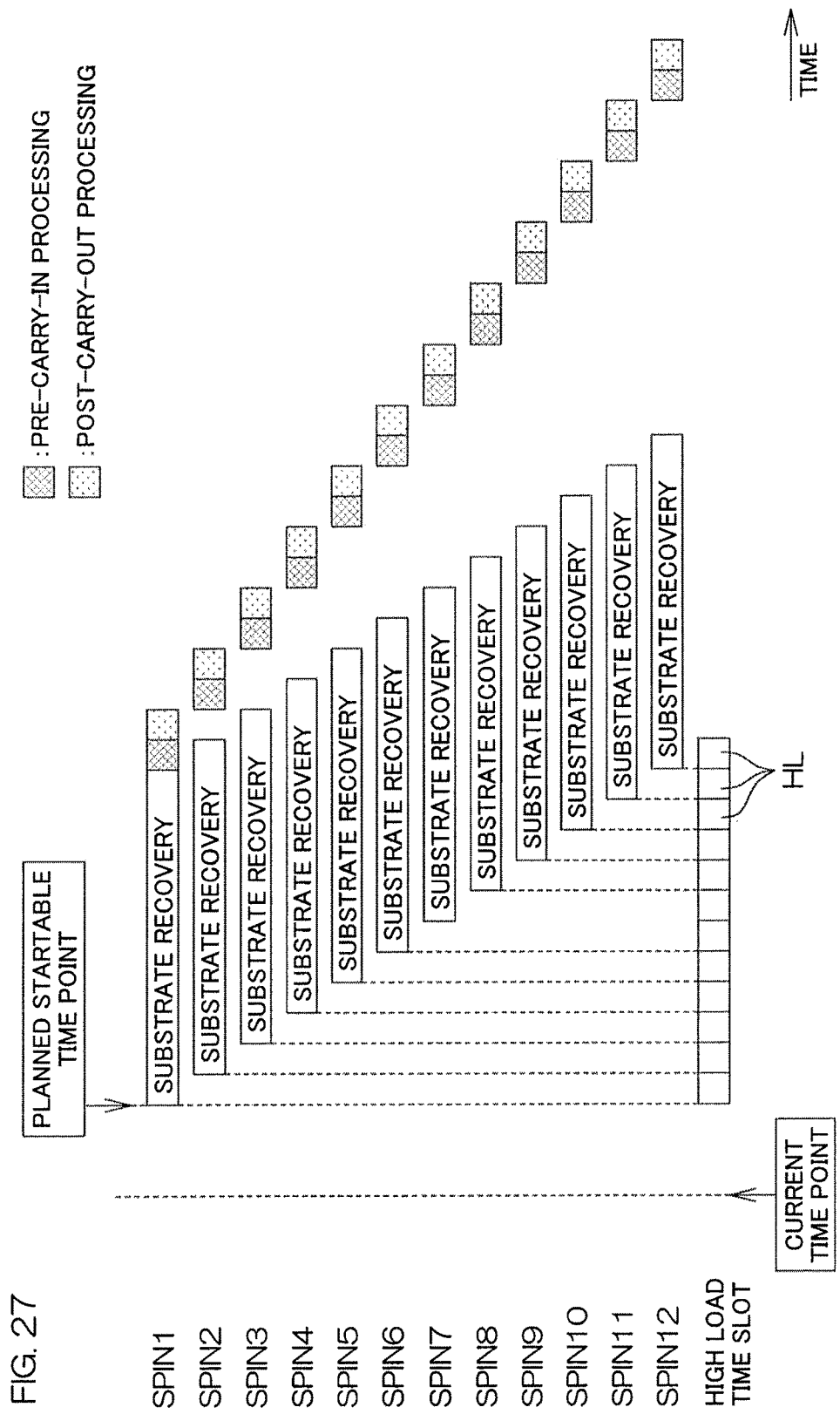
FIG. 27 shows a third modification example of schedule preparation.

FIG. 27 shows a third modification example of schedule preparation. In the third modification example, an example of positioning of post-processing blocks, each of which is a block for specifying a substrate recovery step to be described below, is illustrated.

With the substrate processing apparatus 1, parallel recovery, with which, in a state where substrates W are housed in a plurality of processing units, the substrates W are recovered in a batch from the respective processing units, may be made available. A substrate recovery step is executed at each processing unit prior to the parallel recovery.

The substrate recovery step is a process that is executed to put a substrate W in a state enabling carry-out to the exterior of the processing chamber 17 (see FIG. 3A). A specific example of the substrate recovery step is a water washing processing of the substrate W. By water-washing the substrate W, the substrate W can be transferred to the exterior of the processing chamber 17 regardless of the state of the substrate W before execution of the substrate recovery step. The water washing processing of the substrate W may be executed by discharging a rinse liquid onto the substrate W from the rinse liquid nozzle 59 (see FIG. 3A) while rotating the substrate W. After the substrate recovery steps, the substrates W are carried out from the processing chambers 17 of the respective processing units by the main transfer robot CR (see FIG. 1, etc.).

Each substrate recovery step corresponds to a "high load operation" described above. That is, at a starting time of the substrate recovery step, the serial communication portion 36 of the sub-controller 23 (see FIG. 3B) reads a substrate recovery recipe from the second storage portion 35. The CPU 37 performs data interpretation of the read recipe and generates a control signal for realizing the recipe at a control object processing unit among the processing units SPIN1 to SPIN 12. The serial communication portion 36 sends the generated control signal to the control object processing unit among the processing units SPIN1 to SPIN12. Also, immediately upon receiving the control signal, the control object processing unit among the processing units SPIN1 to SPIN12 sends a reception confirmation signal toward the serial communication portion 36. A data amount of the recipe for the substrate recovery step is enormous and therefore a high control load arises temporarily in the CPU 37 (see FIG. 3B). A high load time slot is thus present at the starting time of the substrate processing step.

If, in planning such substrate recovery steps, blocks of the substrate recovery steps (hereinafter, "substrate recovery blocks") are positioned based just on the logic of "positioning at the earliest position on the time axis so that the same resource is not used overlappingly at the same time," the substrate recovery blocks for the processing units SPIN1 to SPIN12 may be positioned so as to be aligned at the same time period. In this case, the substrate recovery steps at the processing units SPIN1 to SPIN12 are started at the same time so that, as a result of the control load of the second controller 34 concentrating at the starting time of the substrate recovery steps, the second controller 34 cannot perform data processing smoothly and a delay may arise in the substrate recovery steps.

On the other hand, with the example of FIG. 27, each of the substrate recovery blocks is positioned at the earliest position on the time axis so that the same resource is not used overlappingly at the same time and while avoiding the high load information HL from being allocated to the same time slot as the high load information HL of a block that has been positioned already. Therefore, as shown in FIG. 27, the substrate recovery blocks for the processing units SPIN1 to SPIN12 are shiftingly positioned on the time axis with respect to each other. That is, the respective substrate recovery steps at the processing units SPIN1 to SPIN12 are planned so as to be shifted in starting time with respect to each other. A problem, such as processing delay, etc., can thus be avoided in the substrate recovery steps.

Although several preferred embodiments of the present invention have been described above, the present invention may be implemented in yet other modes.

For example, the arrangement of the substrate processing apparatus 1 and the substrate processing contents described above with the preferred embodiments are only an example, and the substrate processing apparatus 1 may adopt other arrangements and the present invention can also be applied to other substrate processing contents.

Also, although with each of the preferred embodiments described above, a case where blocks are positioned so that a plurality of the high load information HL will not be allocated to the same time slot was indicated, an arrangement may be made where allocation of not less than a predetermined number (for example, three) of the high load information HL to the same time slot is prohibited and a plurality of the high load information HL may be allocated to the same time as long as it is less than the predetermined number.

Also, although with each of the preferred embodiments described above, a case where, after the end of the schedule preparation for the first substrate A1, execution of the prepared schedule is started in a state where the schedule preparation is not ended for the second and subsequent substrates (the second substrate) W was cited as an example, the start of the schedules may be executed after preparing the schedules for all substrates W of a process job.

While preferred embodiments of the present invention have been described in detail above, these are merely specific examples used to clarify the technical contents of the present invention, and the present invention should not be interpreted as being limited to these specific examples, and the scope of the present invention shall be limited only by the appended claims.

The present application corresponds to Japanese Patent Application No. 2014-128331 filed on Jun. 23, 2014 in the Japan Patent Office, and the entire disclosure of this application is incorporated herein by reference.

REFERENCE SIGNS LIST

1 Substrate processing apparatus
15 Spin chuck
17 Processing chamber
22 Main controller
23 Sub-controller
24 First controller
25 Input/output portion
26 First storage portion
28 Apparatus management portion
29 Scheduling function portion
30 Scheduling engine
31 Processing execution commanding portion
32 Schedule preparation program
33 Schedule data
34 Second controller
35 Second storage portion
36 Serial communication portion
37 CPU
C Substrate container
CR Main transfer robot
G1 to G4 Processing unit group
IR Indexer robot
PASS Receiving/passing unit
SPIN1 to SPIN12 Processing unit
ST1 to ST4 Stage
W Substrate

The invention claimed is:

1. A schedule preparation method being a method, by which a schedule preparing portion included in a substrate processing apparatus, having at least one single substrate processing unit that processes one substrate at a time and a controller arranged to control the processing unit, prepares a schedule for specifying operations of the substrate processing apparatus in chronological order, and comprising a schedule preparation step of preparing a schedule for each substrate by positioning, in chronological order, a plurality of blocks, each specifying contents of an operation to be performed on the substrate by the substrate processing apparatus, wherein the schedule preparation step includes a high load avoidance positioning step in which, in preparing the schedules for a plurality of substrates, blocks, each corresponding to a high load operation that is an operation in which a high control load occurs at least temporarily in the controller, are positioned on a time axis so that high load time slots, each being a time slot during which a high control load occurs in the controller, are not concentrated, and wherein, at the substrate processing apparatus, after preparation of a schedule for a predetermined first substrate among a plurality of substrates of a process job in common has ended, execution of the prepared schedule is started in a state where preparation of a schedule for a predetermined second substrate, among the plurality of substrates, for which a processing order is later than that of the first substrate, has not ended, and the method further comprises a schedule changing step, in which, after execution of the prepared schedule is started, a yet-to-be-executed portion of the prepared schedule is changed.

2. The schedule preparation method according to claim 1, wherein each of the blocks corresponding to the high load operations has high load information added to a portion corresponding to the high load time slot, and in the high load avoidance positioning step, the blocks corresponding to the high load operations are positioned so that not less than a predetermined number of the high load information are not allocated to the same time slot in preparing the schedules for the plurality of substrates.

3. The schedule preparation method according to claim 1, wherein each of the high load time slots is a starting time of the high load operation.

4. The schedule preparation method according to claim 1, wherein the high load operations include at least one of a substrate processing step, in which the processing unit processes a substrate, a preliminary processing step, in which the processing unit performs preparation for the substrate processing step, a pre-carry-in processing step, in which the processing unit performs an operation for carrying a substrate inside the processing unit, and a substrate recovery step, in which a predetermined processing is applied to a substrate prior to recovery of the substrate from the processing unit.

5. The schedule preparation method according to claim 1, wherein the schedule changing step includes a step, in which, after the start of execution of the schedule, a yet-to-be-executed block in the prepared schedule is deleted, and a repositioning step, in which the deleted block is repositioned in chronological order in parallel to the positioning of blocks for the second substrate.

6. A substrate processing apparatus comprising:

at least one single substrate processing unit that processes one substrate at a time;

a controller arranged to control the processing unit; and a schedule preparing portion arranged to prepare schedules for specifying operations of a resource, including the processing unit, in chronological order; and wherein the controller controls the resource in accordance with the schedules that the schedule preparing portion prepared by the schedule preparation method according to claim 1.

7. The substrate processing apparatus according to claim 6, wherein, after preparation of a schedule for a predetermined first substrate among a plurality of substrates of a process job in common has ended, the controller starts execution of the prepared schedule in a state where preparation of a schedule for a predetermined second substrate, among the plurality of substrates, for which a processing order is later than that of the first substrate, has not ended.

8. A schedule preparation method being a method, by which a schedule preparing portion included in a substrate processing apparatus, having at least one single substrate processing unit that steps one substrate at a time and a controller arranged to control the processing unit, prepares a schedule for specifying operations of the substrate processing apparatus in chronological order, and comprising a schedule preparation step of preparing a schedule for each substrate by positioning, in chronological order, a plurality of blocks, each specifying contents of an operation to be performed on the substrate by the substrate processing apparatus, by the schedule preparing portion, wherein the schedule preparation step includes a determining step of determining whether the operation corresponding to the block includes high load time slots, each being a time slot during which a high control load occurs in the controller, are not concentrated, an assignment step of assigning a high load information to a part of the block corresponding to the high load time slots, when the operation corresponding to the high load time slots, and a high load avoidance positioning step in which, blocks, each corresponding to a high load operation that is an operation in which a high control load occurs at least temporarily in the controller, are positioned on a time axis based on the high load information.

9. The schedule preparation method according to claim 8, wherein the determining step includes a step of determining whether the operation corresponding to the block includes high load time slots by comparing a load in the operation corresponding to the block with a reference range defined as the high load time slot.

* * * * *